(12) United States Patent
Suzuki

(10) Patent No.: US 7,056,959 B2
(45) Date of Patent: Jun. 6, 2006

(54) DYE-CONTAINING CURABLE COMPOSITION AND COLOR FILTER USING THE SAME

(75) Inventor: Nobuo Suzuki, Shizuoka-ken (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 173 days.

(21) Appl. No.: 10/702,766

(22) Filed: Nov. 7, 2003

(65) Prior Publication Data

US 2004/0102548 A1 May 27, 2004

(30) Foreign Application Priority Data

Nov. 8, 2002 (JP) .............................. 2002-325256
Jan. 29, 2003 (JP) .............................. 2003-020234

(51) Int. Cl.
*G03F 7/22* (2006.01)
*G03F 7/00* (2006.01)
*G03C 1/67* (2006.01)
*G03C 1/52* (2006.01)

(52) U.S. Cl. .............................. 522/26; 522/75; 430/7
(58) Field of Classification Search ................ 522/26, 522/75
See application file for complete search history.

(56) References Cited

U.S. PATENT DOCUMENTS

| | | | | |
|---|---|---|---|---|
| 5,348,840 A | * | 9/1994 | Sakamoto et al. | ..... 430/270.17 |
| 5,478,680 A | * | 12/1995 | Hishiro et al. | ................. 430/7 |
| 5,539,064 A | * | 7/1996 | Hashimoto et al. | ......... 525/529 |
| 5,820,962 A | * | 10/1998 | Kimura et al. | ............. 428/64.1 |
| 6,232,038 B1 | * | 5/2001 | Takasaki et al. | ......... 430/281.1 |
| 6,713,227 B1 | * | 3/2004 | Machiguchi et al. | .... 430/270.1 |
| 6,770,405 B1 | * | 8/2004 | Ueda et al. | ..................... 430/7 |
| 2004/0030125 A1 | * | 2/2004 | Li et al. | ..................... 540/126 |
| 2004/0131958 A1 | * | 7/2004 | Feng et al. | .................... 430/32 |
| 2004/0202946 A1 | * | 10/2004 | Ueda et al. | ..................... 430/7 |
| 2004/0246321 A1 | * | 12/2004 | Takashima et al. | ......... 347/100 |
| 2005/0039274 A1 | * | 2/2005 | Yang et al. | ..................... 8/686 |
| 2005/0104944 A1 | * | 5/2005 | Robertson et al. | .......... 347/100 |
| 2005/0126436 A1 | * | 6/2005 | Patel et al. | ............. 106/31.49 |

FOREIGN PATENT DOCUMENTS

| | | |
|---|---|---|
| JP | 1-102469 | 4/1989 |
| JP | 2-127602 | 5/1990 |
| JP | 6-75375 | 3/1994 |
| JP | 7-140654 | 6/1995 |

OTHER PUBLICATIONS

Leznoff, et al.; Metallophthalocyanine dimers incorporating five-atom covalent bridges; Canadian Journal of Chemistry, vol. 63, pp. 623-631 (1985).

* cited by examiner

*Primary Examiner*—Susan Berman
(74) *Attorney, Agent, or Firm*—Sughrue Mion, PLLC

(57) ABSTRACT

A dye-containing curable composition contains at least an alkali soluble resin, a dye, and a photosensitive compound, the dye being a phthalocyanine compound represented by the following general formula (I):

$$M\text{-}Pc\text{-}(Y)_l \qquad \text{General Formula (I)}$$

wherein M represents a metallic atom, a metallic oxide, a metallic chloride or a hydrogen atom; Pc represents a phthalocyanine skeleton; Y represents a fluorine-substituted alkoxy group; and l denotes an integer from 1 to 8.

12 Claims, No Drawings

DYE-CONTAINING CURABLE COMPOSITION AND COLOR FILTER USING THE SAME

CROSS-REFERENCE TO RELATED APPLICATION

This application claims priority under 35USC 119 from Japanese Patent Application Nos. 2002-325256 and 2003-20234, the disclosures of which are incorporated by reference herein.

BACKGROUND OF THE INVENTION

1. Field of the Invention

The present invention relates to a dye-containing curable composition suitable for producing a color filter used in a liquid crystal display device and a solid state image sensing device, a color filter for electroluminescence, an ink for printing, an ink for ink-jet printing, and a paint, and also relates to a color filter using the dye-containing curable composition and a process for producing the same.

2. Description of the Related Art

As a process for producing a color filter used in a liquid crystal display device and a solid state image sensing device, a dyeing method, a printing method, an electrodepositing method and a pigment dispersing method have been known.

The dyeing method is such a method for producing a color filter in that a dyeing base material formed with a natural resin, such as gelatin, glue and casein, or a synthetic resin, such as an amine-modified polyvinyl alcohol, is dyed with a dye, such as an acidic dye. Since a dye is used as a coloring material in the dyeing method, there is a problem in light resistance, heat resistance and moisture resistance, and color unevenness is liable to occur in the case of a large size because dyeing and fixing characteristics are difficult to be uniformly controlled. Furthermore, a dyeing preventing layer is necessary upon dyeing, and thus such a problem arises in that the process becomes complicated.

The electrodepositing method is such a method for producing a color filter in that a transparent electrode is previously formed in a prescribed pattern, and a resin containing a pigment dissolved or dispersed in a solvent is ionized, to which a voltage is applied to form a colored image in the form of the pattern. In the electrodepositing method, a photolithographic process containing film formation and etching for the transparent electrode is necessary in addition to a transparent electrode for displaying. In the case where an electric short circuit is formed at this time, line defects are formed to cause reduction in yield. Furthermore, patterns other than stripe patterns, for example, mosaic patterns, are difficult to be applied in principle, and also, there is such a problem in that the transparent electrode is difficult to be handled.

The printing method is a simple method for producing a color filter by printing, such as offset printing, by using an ink formed by dispersing a pigment in a thermosetting resin or an ultraviolet ray curable resin. However, an ink that can be used has a high viscosity to make filtration difficult, whereby defects are liable to occur due to dusts, foreign matter and gelled matters of the ink binder, and there are problems in positional accuracy, line width accuracy and surface smoothness associated with printing accuracy.

The pigment dispersing method is a method for producing a color filter by a photolithographic process using a colored radiation sensitive composition containing a pigment dispersed in various kinds of photosensitive compositions. This method is stable to light and heat owing to the use of the pigment, and sufficient positional accuracy is ensured since patterning is carried out by a photolithographic process. Therefore, it is a method suitable for producing a color filter for a large size and high definition color display.

In order to produce a color filter by the pigment dispersing method, a radiation sensitive composition is coated on a substrate with a spin coater, a roll coater or the like and dried to form a coated film, and the coated film is exposed patternwise and then developed to obtain colored pixels. The operation is repeated for respective color hues to obtain a color filter.

As the pigment dispersing method, for example, JP-A No. 1-102469 and No. 4-76062 disclose negative photosensitive compositions using an alkali soluble resin with a photopolymerizable monomer and a photopolymerization initiator in combination. However, while higher definition is demanded for a color filter for a solid state image sensing device in recent years, the conventional pigment dispersing method inherently cannot improve resolution due to the pigment present in a particle state having a certain size, and there is a problem in formation of color unevenness due to coarse particles of the pigment. Therefore, it is not suitable for a purpose that requires a fine pattern, such as a solid state image sensing device.

In order to attain such a high resolution, techniques using a dye, which has been used as a coloring material, have been investigated, and two kinds of photosensitive colored compositions using a dye have been proposed, i.e., a positive photosensitive colored composition using a naphthoquinonediazide as a photosensitive material (as described, for example, in JP-A No. 2-127602), and a negative photosensitive colored composition using a photopolymerization initiator (using a crosslinking agent in combination) as a photosensitive material (as described, for example, in JP-A No. 6-75375). However, these photosensitive colored compositions have problems in solvent solubility, and also have such a problem in that the dye is poor in heat resistance and light resistance.

In view of the circumstances, a phthalocyanine compound can be considered as a dye excellent in heat resistance and light resistance. However, it is poor in solvent solubility, and in the case where the solvent solubility is intended to be improved, such a problem arises in that the heat resistance and the light resistance thereof are deteriorated. Therefore, it is the current situation that such a dye-containing curable composition and a color filter have not yet been provided that use a dye excellent in all solvent solubility, heat resistance and light resistance to provide excellent heat resistance and light resistance.

Under the circumstances, for example, a phthalocyanine dye with Cu, Co or Zn as a central metal having a bulky alkyl or alkoxy group introduced therein for improving the solubility thereof has been proposed in Canadian Journal of Chemistry, vol. 63, p. 623 to 631 (1985). However, the solubility in a halogenated hydrocarbon is improved, but the solubility to other solvents is still insufficient.

In view of improvement in solubility of a phthalocyanine dye, it has been investigated that a monosubstituent is introduced on the nitrogen atom of a metallic phthalocyaninesulfoneamide. For example, a compound having a primary alkoxyalkyl group bonded to the nitrogen atom is described in JP-A No. 3-195783. However, sufficient solubility has not yet been obtained thereby.

SUMMARY OF THE INVENTION

The present invention has been developed in view of the aforementioned circumstances and intends to attain the following objects.

An object of the invention is to provide a stable dye-containing curable composition that contains a phthalocyanine compound excellent in solvent solubility and is good in heat resistance and light resistance, and that is particularly suitable for cyan color.

Another object of the invention is to provide such a color filter that is good in sharpness and hue and is particularly excellent in heat resistance and light resistance, and to provide a process for producing a color filter capable of producing such a color filter that is constituted to have a high resolution with a good rectangular pattern and has heat resistance and light resistance.

As a result of earnest investigations made by the inventor, it has been found that a particular phthalocyanine compound is excellent in solvent solubility and is suitable for improving heat resistance and light resistance of a curable composition (particularly for cyan color), and thus the invention has been completed.

Specific aspects for solving the aforementioned problems are as follows.

A first aspect of the invention is to provide a dye-containing curable composition containing an alkali soluble resin, a dye, and a photosensitive compound, the dye being a phthalocyanine compound represented by the followinw general formula (I):

$$\text{M-Pc-(Y)}_l \qquad \text{General Formula (I)}$$

wherein M represents a metallic atom, a metallic oxide, a metallic chloride or a hydrogen atom; Pc represents a phthalocyanine skeleton; Y represents a fluorine-substituted alkoxy group; and l denotes an integer from 1 to 8.

The invention also relates to a color filter containing a dye-containing curable composition according to the first aspect, and a process for producing a color filter containing steps of coating a dye-containing curable composition according to the first aspect on a support, exposing the coated composition through a mask, and developing the exposed composition to form a pattern.

The inventor has found that a compound having a structure containing, as a phthalocyanine skeleton constituting a dye, a secondary alkyl group has a sulfonamide group bonded to a nitrogen atom, in which in particular, the secondary alkyl group contains an oxygen atom as an ether bond, a carbonyl bond or an ester bond, is excellent in solvent solubility, and that a photosensitive curable composition (particularly for cyan color) constituted by using the compound exhibits particularly excellent heat resistance and light resistance.

A second aspect of the invention is to provide a dye-containing curable composition containing an alkali soluble resin, a dye, and a photosensitive compound, the dye being a phthalocyanine compound represented by the following general formula (IV):

General Formula (IV)

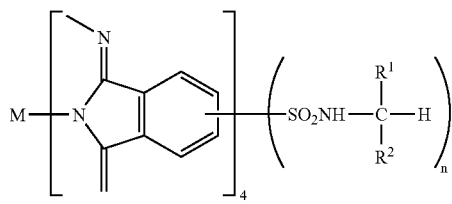

wherein $R^1$ and $R^2$ each independently represent an unsubstituted alkyl group, a substituted alkyl group substituted with a group containing an oxygen atom as an ether bond, a carbonyl bond or an ester bond, an alkylcarbonyl group or an alkoxycarbonyl group, provided that one of $R^1$ and $R^2$ represents a substituted alkyl group substituted with a group containing an oxygen atom as an ether bond, a carbonyl bond or an ester bond, an alkylcarbonyl group or an alkoxycarbonyl group; n denotes an integer from 1 to 4; and M represents a divalent metallic atom, a trivalent monosubstituted metallic atom, a tetravalent disubstituted metallic atom or an oxymetal.

The invention also relates to a color filter containing an alkali soluble resin and a dye, the dye being a phthalocyanine compound represented by the general formula (IV).

The invention also relates to a process for producing a color filter containing steps of coating a dye-containing curable composition according to the second aspect on a support, exposing the coated composition through a mask, and developing the exposed composition to form a pattern.

As discussed in the above, the ordinary phthalocyanine dye is significantly poor in solubility, and thus, production of a color filter with a photosensitive colored composition containing the dye by a coating method is difficult. Furthermore, the storage stability of the photosensitive colored composition as a solution is insufficient, and the dye is deposited with the lapse of time to fail to provide practicability. In the invention, on the other hand, the solvent solubility of a dye is improved to reduce deposition of the dye from a dye-containing curable composition and deposition of the dye from the coated film, whereby a stable curable composition is obtained. Furthermore, a color filter having high performance can be obtained owing to the improved heat resistance and light resistance.

DETAILED DESCRIPTION OF THE INVENTION

The dye-containing curable composition, a color filter (preferably using the dye-containing curable composition), and the process for producing the color filter, according to the present invention will be described in detail below.

<Dye-containing Curable Composition>

The dye-containing curable composition of the invention contains at least (A) an alkali soluble resin, (B) a dye, and (C) a photosensitive compound, and generally also contains (D) a solvent, and a phthalocyanine compound represented by the following general formula (I) or (IV) is contained as the dye (B). The dye-containing curable composition of the invention can be constituted as a positive type in the case where a naphthoquinonediazide compound is contained as the component (C), and can be constituted as a negative type in the case where a photopolymerization initiator is contained as the component (C). In the case where the negative type is constituted, (E) a crosslinking agent is generally further contained, and in the case where the positive type is constituted, (E) a crosslinking agent may be contained (preferably in combination with a photopolymerization initiator). Other components may be contained depending on necessity.

The dye constituting one of the characteristic features of the invention will be described in detail.

(B) Dye

In the invention, a phthalocyanine compound (dye) represented by the following general formula (I) or (IV) is contained as a coloring component.

The phthalocyanine compound represented by the general formula (I) will be described.

$$\text{M-PC-(Y)}_l \qquad \text{General Formula (I)}$$

In the general formula (I), Pc represents a phthalocyanine skeleton. The phthalocyanine skeleton represented by Pc can be represented by the following general formula (III):

General Formula (III)

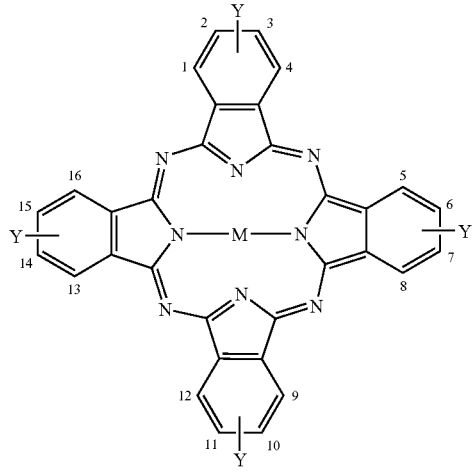

The group represented by Y in the general formula (III) is bonded (substituted) to one of the α-position of the phthalocyanine nucleus (i.e., the 1, 4, 5, 8, 9, 12, 13 or 16-position in the general formula (III)) and the β-position thereof (i.e., the 2, 3, 6, 7, 10, 11, 14 or 15-position in the general formula (III)), and is preferably bonded to the α-position rather than the β-position since a large effect can be obtained on preventing molecular association, and the extinction coefficient can be improved.

The expressions of the α-position and the β-position are used for indicating the substitution position of the group represented by Y on the phthalocyanine nucleus, and they are defined as follows. The phthalocyanine skelton has a tetrazaporphyrin skeleton with four benzene ring condensed on the outer periphery thereof, and there are four positions, on which a substituent can be introduced, on each of the benzene rings. Among these, two positions near the tetrazaporphyrin skeleton are designated as the α-positions, and two positions far from the tetrazaporphyrin skeleton are designated as the β-positions. For example, in the case where a phthalonitrile compound substituted on the 3-position is cyclized, a phthalocyanine compound having a substituent on the α-position, and the compound is a mixture of the following four kinds of isomers. In the following operation, a mixture of isomers is inclusively handled, but the isomers may be used after isolation depending on necessity.

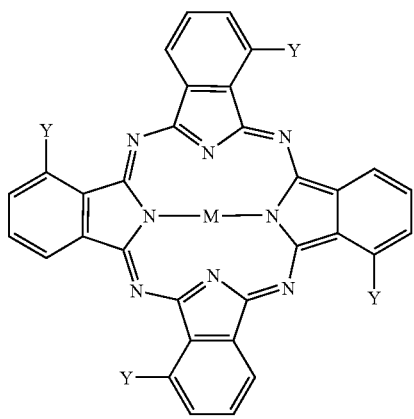

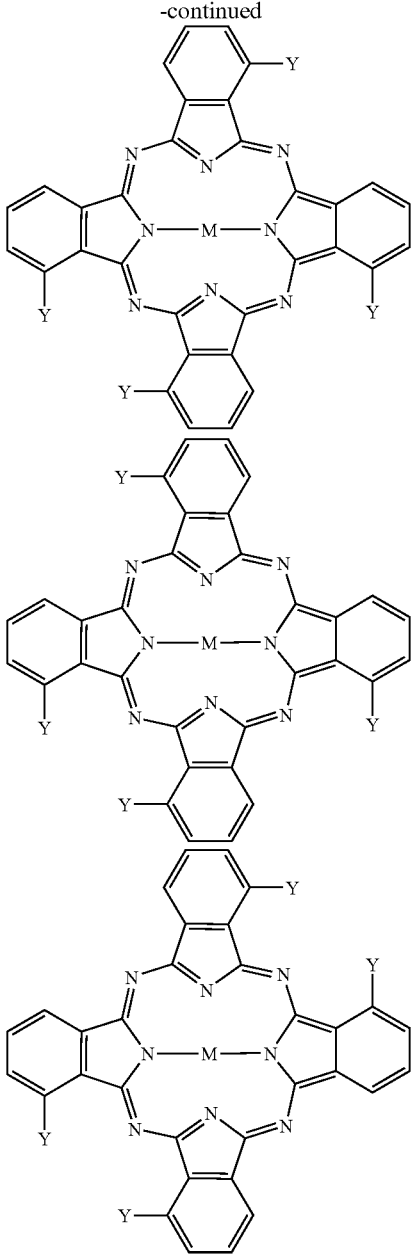

In the general formula (I), M represents a metallic atom, a metallic oxide, a metallic chloride or a hydrogen atom. Specific examples of M include a metal, such as Pb, Cu, Co, Ni, Mn, Zn, Fe, Pd and Mg, a metallic oxide, such as VO, a metallic chloride, such as AlCl, and $H_2$ (diatomic hydrogen). Among these, Pb, Cu, Co, Ni, Mn, Zn, Pd and VO are preferred from the standpoint of solubility, heat resistance and light resistance.

In the general formula (I), Y represents a fluorine-substituted alkoxy group, and 1 denotes an integer from 1 to 8, provided that the number of groups represented by Y, i.e., the number of 1, is per one phthalocyanine nucleus.

The group represented by Y is preferably a linear or branched alkoxy group having at least one fluorine atom substituted thereon and can be appropriately selected therefrom. In particular, a group represented by the following general formula (II) is preferred from the standpoint of availability of raw materials. The position where the group represented by the general formula (II) is substituted is one of the 1- to 16-positions in the general formula (III) as described in the foregoing, and preferably the α-positions.

—O—(CH$_2$)$_m$(CF$_2$)$_n$X   General Formula (II)

In the general formula (II), X represents a hydrogen atom or a fluorine atom; m denotes an integer from 1 to 6; and n denotes an integer from 1 to 8.

Among the compounds represented by the general formula (I), such embodiments are preferred in that Y represents a group represented by the general formula (II) (a fluorine-substituted alkoxy group), M represents a cobalt atom (Co), and the number of the groups represented by Y, i.e., the number of 1, is 4.

The phthalocyanine compound represented by the general formula (I) having a fluorine-substituted alkoxy group (fluoroalkoxy group) is excellent in solubility in solvents owing to the low cohesive energy of the fluoroalkoxy group, in comparison to a phthalocyanine compound having a simple alkoxy group. Furthermore, since Co (cobalt atom) is coordinated at the center of the phthalocyanine skeleton constituting the phthalocyanine compound, excellent performance is exhibited in both the solubility to solvents and stability in the state where the compound is dissolved in a solvent, in comparison to compounds having other metals coordinated. Moreover, four fluoroalkoxy groups are substituted (tetra-substituted) on the α-positions of the phthalocyanine skeleton, whereby the solubility in solvents is further improved in comparison to compounds having fluoroalkoxy groups tetra-substituted on the β-positions.

Among the phthalocyanine compounds represented by the general formula (I), such an α-tetra(fluoroalkoxy)-substituted phthalocyanine compound is preferred from the standpoint of solubility in that the substitution positions of the groups represented by Y are the α-positions of the phthalocyanine skelton, and in particular, m is 1 or 2, and n is from 3 to 5.

As shown in the general formula (III), among the 16 substitution positions of the phthalocyanine skeleton, hydrogen atoms are substituted on the remaining substitution positions other than those having the groups represented by Y are substituted. A part or all of the remaining substitution positions may be substituted, for example, with an alkyl group, an alkoxy group or a halogen atom, such as a chlorine atom.

The phthalocyanine compound represented by the general formula (I) can be preferably produced by the method shown by the following reaction scheme.

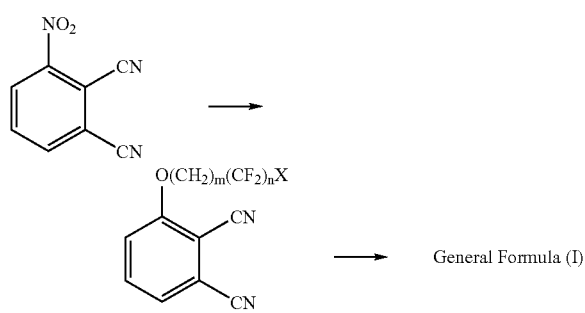

General Formula (I)

In the production method of the phthalocyanine compound represented by the general formula (I), 3-nitrophthalonitrile or 4-nitrophthalonitrile and a fluoroalcohol are reacted in a non-protonic polar solvent, such as DMF, DMSO, N-methylpyrrolidone and sulfolane, in the presence of potassium carbonate to produce 3-(fluoroalkoxy)phthalonitrile or 4-(fluoroalkoxy)phthalonitrile, and the resulting fluorine-containing phthalonitrile is converted to a phthalocyanine with a metallic salt or an elemental metal though a known method.

Specific examples of the phthalocyanine compound represented by the general formula (I) are shown below (Example Compounds 1 to 20), but the invention is not limited to them.

Example Compound 1:
α-tetra(2,2,3,3,4,4,5,5-octafluoropentyloxy)-cobaltphthalocyanine Example Compound 2:
α-tetra(2,2,3,3,4,4,5,5-octafluoropentyloxy)-vanadylphthalocyanine Example Compound 3:
α-tetra(2,2,3,3-tetrafluoropropoxy)-cobaltphthalocyanine Example Compound 4:
α-tetra(2,2,3,3-tetrafluoropropoxy)-vanadylphthalocyanine Example Compound 5:
α-tetra(2,2,2-trifluoroethoxy)-cobaltphthalocyanine Example Compound 6:
α-tetra(2,2,2-trifluoroethoxy)-vanadylphthalocyanine Example Compound 7:
α-tetra(2,2,3,3,4,4,5,5-octafluoropentyloxy)-copperphthalocyanine Example Compound 8:
α-tetra(2,2,3,3,4,4,5,5-octafluoropentyloxy)-zincphthalocyanine Example Compound 9:
α-tetra(2,2,3,3,4,4,5,5-octafluoropentyloxy)-palladiumphthalocyanine Example Compound 10:
α-tetra(2,2,3,3-tetrafluoropropoxy)-phthalocyanine Example Compound 11:
β-tetra(2,2,3,3,4,4,5,5-octafluoropentyloxy)-cobaltphthalocyanine Example Compound 12:
β-tetra(2,2,3,3,4,4,5,5-octafluoropentyloxy)-vanadylphthalocyanine Example Compound 13:
β-tetra(2,2,3,3-tetrafluoropropoxy)-cobaltphthalocyanine Example Compound 14:
β-tetra(2,2,3,3-tetrafluoropropoxy)-vanadylphthalocyanine Example Compound 15:
β-tetra(2,2,2-trifluoroethoxy)-cobaltphthalocyanine Example Compound 16:
β-tetra(2,2,2-trifluoroethoxy)-vanadylphthalocyanine Example Compound 17:
β-tetra(2,2,3,3,4,4,5,5-octafluoropentyloxy)-copperphthalocyanine Example Compound 18:
β-tetra(2,2,3,3,4,4,5,5-octafluoropentyloxy)-zincphthalocyanine Example Compound 19:
β-tetra(2,2,3,3,4,4,5,5-octafluoropentyloxy)-palladiumphthalocyanine Example Compound 20:
β-tetra(2,2,3,3-tetrafluoropropoxy)-phthalocyanine The aforementioned example phthalocyanine compounds can be synthesized by a method described in JP-B No. 7-37582 and other known method. Examples thereof will be described below.

SYNTHESIS EXAMPLE

Synthesis of α-tetra(2,2,3,3,4,4,5,5-octafluoropentyloxy)-cobaltphthalocyanine (1) 3-(2,2,3,3,4,4,5,5-octafluoropentyloxy)-phthalonitrile (an intermediate of Example Compound 1) is synthesized in the following manner.

43.3 g of 3-nitrophthalonitrile, 69.6 g of 2,2,3,3,4,4,5,5-octafluoropentanol and 200 mL of DMSO were placed in a 500-mL reaction flask equipped with a condenser, a thermometer, a nitrogen introducing tube and a stirrer, and after adding 58.7 g of potassium carbonate to the mixture under stirring, the temperature was increased to 70° C. under nitrogen stream, followed by stirring for 2 hours at that temperature. During the reaction, the reaction system was under nitrogen stream. After standing to cool, 1,000 mL of water was added dropwise to the reaction mixture, so as to deposit the reaction product as crystals. It was filtered, washed with water and dried at 60° C. for 12 hours to obtain 85.9 g of an objective intermediate (yield: 96.5%). The results of gas chromatography and mass spectrum analysis of the intermediate confirmed a molecular ion peak $M^+=358$.

(2) Example Compound 1 is synthesized from the intermediate.

10.8 g of the intermediate (phthalonitrile derivative) obtained in the item (1) above, 1.95 g of anhydrous cobalt chloride, 5.4 g of urea, 0.25 g of ammonium molybdate and 30 mL of diethylene glycol dimethyl ether were placed in a 100-mL reaction flask equipped with a condenser, a thermometer and a stirrer, and after replacing the reaction system with nitrogen, it was increased to 150° C., followed by stirring for 12 hours at that temperature. After standing to cool, the reaction mixture was filtrated with a filtering agent, and insoluble matters were washed with 120 mL of isopropanol. The solvent was distilled off under reduced pressure from the washing filtrate to obtain a tarry dye, which was then dissolved in 150 mL of methanol. The resulting solution was added dropwise to 100 mL of water under stirring to crystallize the dye. The dye was collected, washed with a methanol/water mixture (2/1 by volume), and dried at 100° C. for 12 hours to obtain 8.4 g of a crude dye (yield: 74.9%).

The thus resulting crude dye was dissolved in 150 mL of a toluene/ethyl acetate mixture (4/1 by volume), and 20 g of activated clay, followed by stirring at room temperature for 1 hour. The mixture was filtrated, and insoluble matters were washed with a toluene/ethyl acetate mixture (4/1 by volume). The solvent was distilled off from the washing filtrate to obtain 8.05 g of a purified dye (yield: 72.0%).

The results of liquid chromatography and mass spectrum analysis of the resulting dye confirmed a molecular ion peak $M^+=1,491$. The result of ultraviolet and visible absorption spectrum in THF revealed $\lambda_{max}=673$ nm ($\epsilon=151,000$).

In the dye-containing curable composition of the invention, the phthalocyanine compound represented by the general formula (I) may be used solely or in combination of plural kinds thereof. Furthermore, a known dye may be used in addition to the phthalocyanine compound represented by the general formula (I).

The known dye may be appropriately selected from organic solvent soluble dyes depending on the necessary spectrum absorption. Examples of species of the dye include an acidic dye, a basic dye, a disperse dye, a reaction product of an acidic dye with a basic compound, and a reaction product of a basic dye with an acidic compound, which is solubilized in an organic solvent. Furthermore, an oil soluble dye may be preferably selected from dyes described in C.I. Solvent Dye.

It is necessary that the dye has a desired spectrum as a color filter, is dissolved in the solvent or the solution containing the alkali soluble resin in a necessary concentration, and does not cause deposition or aggregation with the lapse of time. The dye may be appropriately selected from C.I. Solvent Colors described in Color Index. A dye that has suitable solvent solubility and spectrum may be selected from an oil soluble dye, an acidic dye, a disperse dye, a reactive dye and a direct dye. The solubility of a dye in an organic solvent referred herein means that it is dissolved in a solvent in a concentration of 1% by mass or more.

The content of the dye represented by the general formula (I) (and the known dye depending on necessity) in the dye-containing curable composition is preferably from 1 to 80% by mass, more preferably from 3 to 50% by mass, and particularly preferably from 5 to 30% by mass, based on the total solid content (by mass) of the composition. It is preferred that the proportion of the dye is smaller from the standpoint of sensitivity and developing property as far as the spectral characteristics are not impaired.

The phthalocyanine compound represented by the general formula (IV) will be described.

General Formula (IV)

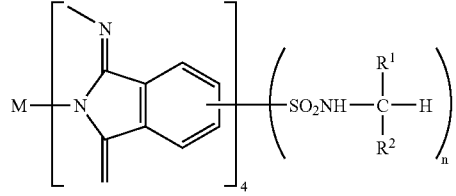

In the general formula (IV), $R^1$ and $R^2$ each independently represent an unsubstituted alkyl group, a substituted alkyl group substituted with a group containing an oxygen atom as an ether bond, a carbonyl bond or an ester bond, an alkylcarbonyl group or an alkoxycarbonyl group, provided that at least one of $R^1$ and $R^2$ represents a substituted alkyl group substituted with a group containing an oxygen atom as an ether bond, a carbonyl bond or an ester bond, an alkylcarbonyl group or an alkoxycarbonyl group.

The alkyl group represented by $R^1$ or $R^2$ is preferably an alkyl group having 1 to 8 carbon atoms, and examples thereof include a methyl group, an ethyl group, a propyl group, an isopropyl group, a butyl group, an isobutyl group, a pentyl group, a hexyl group and an octyl group.

The alkyl group, which is substituted with a group containing an oxygen atom as an ether bond, a carbonyl bond or an ester bond, represented by $R^1$ or $R^2$ is preferably a substituted alkyl group having 1 to 4 oxygen atoms and 1 to 12 carbon atoms in total. Examples of the alkylcarbonyl group represented by $R^1$ or $R^2$ is preferably an alkylcarbonyl group having 2 to 12 carbon atoms, and the alkoxycarbonyl group represented by $R^1$ or $R^2$ is preferably an alkoxycarbonyl group having 2 to 12 carbon atoms.

Specific examples of the substituted alkyl group, the alkylcarbonyl group and the alkoxycarbonyl group represented by $R^1$ or $R^2$ include a methoxyethyl group, an ethoxyethyl group, a methoxyethoxyethyl group, an ethoxyethoxyethyl group, an acetyl group, an acetylmethyl group, an acetylethyl group, a propyonyl group, a propyonylmethyl group, a propyonylethyl group, a propyonylcarbonyl group, a methoxycarbonyl group, an ethoxycarbonyl group, a propoxycarbonyl group, a butoxycarbonyl group, a pentoxycarbonyl group, an acetyloxy group, a propyonyloxy group, a butylcarbonyloxy group, a hexylcarbonyloxy group, a heptylcarbonyloxy group, a tetrahydrofurfuryloxymethyl group, a 2,2-dimethyl-1,3-dioxolane-4-methoxymethyl group and a 2-(1,3-dioxane)ethoxymethyl group.

In the general formula (IV), the substitution position of the sulfonic acid amide group as the substituent on the phthalocyanine skeleton may be either the α-position or the β-position of the phthalocyanine skeleton, and is more preferably the α-position.

The number of the sulfonic acid amide group bonded to the phthalocyanine skeleton represented by n is from 1 to 4, and preferably from 3 to 4.

M represents a divalent metallic atom, a trivalent monosubstituted metallic atom, a tetravalent disubstituted metallic atom or an oxymetal. Any metal may be used as far as that is not dissociated during the reaction and the treatment after the reaction, and it is preferably selected from Cu, Co, Pd, VO, AlCl, and AlOH with Cu being more preferred.

The phthalocyanine compound represented by the general formula (IV) has, as a structural characteristic feature, (i) a sulfonamide group having a secondary alkyl group bonded to the nitrogen atom as a substituent on the phthalocyanine skeleton, and (ii) an oxygen atom in the secondary alkyl group in the form of an ether bond, a carbonyl bond or an ester bond. According to the feature, the compound is excellent in solvent solubility, and the curable composition (particularly for cyan color) constituted by using the compound exerts particularly good heat resistance and light resistance. In the case where the substituent modifying the sulfonamide group as a substituent on the phthalocyanine compound is a primary alkyl group rather than a secondary alkyl group, the phthalocyanine compound is insufficient in solubility even though it contains an oxygen atom. In the case where the substituent modifying the sulfonamide group is a tertiary alkyl group, not only the solubility is insufficient, but also the thermal stability of the phthalocyanine compound is deteriorated, and furthermore, in the case where the alkyl group has an oxygen atom in the form of a hydroxyl group, the solubility of the phthalocyanine compound is further deteriorated.

A production process of the phthalocyanine compound represented by the general formula (IV) will be described. The phthalocyanine compound according to the invention can be produced, for example, in the following manner, but the invention is not limited thereto.

An unsubstituted metallic phthalocyanine compound is added by small portions in three times to ten times amount (by weight) of chlorosulfonic acid while maintaining at 18° C. or less. After stirring at that temperature for 1 hour, the temperature is increased at a rate of 0.5 to 1° C. per minute, and the mixture is reacted at a temperature of 130 to 135° C. for from 4 to 6 hours. Thereafter, the mixture was cooled to 70 to 85° C., thionyl chloride in an amount of twice to six times the amount of the unsubstituted metallic phthalocyanine is added dropwise while maintaining at from 70 to 80° C. over 10 to 15 hours. After stirring for several hours at that temperature, the mixture was cooled to 15 to 20° C. and continuously stirred for from 10 to 15 hours. The reaction mixture is discharged by small portions into iced water in an amount of 50 times to 200 times the amount of the metallic phthalocyanine. The resulting deposit is filtrated and washed with iced water until becoming neutral, followed by drying, to obtain a metallic phthalocyanine sulfonylchloride.

The aforementioned reaction conditions are those mainly for obtaining a metallic phthalocyanine tetrasulfonylchloride. In the case where a mono-, di- or tri-substituted sulfonylchloride is to be obtained, it is enabled by relaxing the conditions in the chlorosulfonic acid. That is, it can be attained by lowering the reaction temperature or by shortening the reaction time.

To the metallic phthalocyanine sulfonylchloride thus obtained, twice amount by weight of an oxygen-containing organic amine compound is added dropwise while maintaining at 15° C. or less. After completing the dropwise addition, the mixture is stirred at from 20 to 30° C. for from 15 to 20 hours, and then it is filtered, washed with water and dried to obtain the objective phthalocyanine compound represented by the general formula (IV).

Specific examples of the phthalocyanine compound represented by the general formula (IV) are shown below (Example Compounds 21 to 54), but the invention is not limited to them.

| Example compound No. | M | Substitution position on phthalocyanine ring | n | —$R^1$ | —$R^2$ |
|---|---|---|---|---|---|
| Example compound 21 | Cu | α-position | 4 | —$C_2H_5$ | —$CH_2OCH_3$ |
| Example compound 22 | Co | α-position | 2 | —$C_2H_5$ | —$CH_2OC_2H_5$ |
| Example compound 23 | Cu | α-position | 4 | —$C_2H_5$ | —$CH_2OC_2H_4OC_2H_5$ |
| Example compound 24 | Cu | α-position | 3 | —$C_2H_5$ | —$CH_2OC_2H_4$—(1,3-dioxane) |
| Example compound 25 | Cu | β-position | 4 | —$CH_3$ | —$CH_2OC_2H_4$—(1,3-dioxolane) |

-continued

| Example compound No. | M | Substitution position on phthalocyanine ring | n | —R¹ | —R² |
|---|---|---|---|---|---|
| Example compound 26 | Cu | α-position | 4 | —CH₃ | —CH₂OCH₂-[2,2-dimethyl-1,3-dioxolan-4-yl] 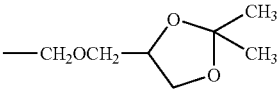 |
| Example Compound 27 | Cu | α-position | 2 | —CH₂OC₂H₅ | —CH₂OC₂H₅ |
| Example compound 28 | Pd | α-position | 1 | —CH₂OCH₂-(tetrahydrofuran-2-yl) 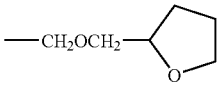 | —CH₂OCH₂-(tetrahydrofuran-2-yl) 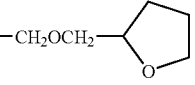 |
| Example compound 29 | AlCl | α-position | 4 | -i-C₃H₇ | —CH₂OCH₃ |
| Example compound 30 | Cu | α-position | 4 | —C₂H₅ | 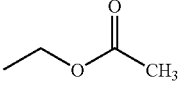 |
| Example compound 31 | Cu | α-position | 4 | —CH₃ | 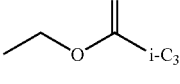 |
| Example compound 32 | Cu | α-position | 4 | 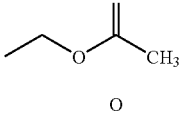 | 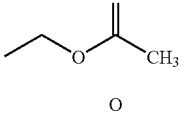 |
| Example compound 33 | Cu | β-position | 4 | 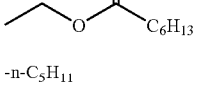 | 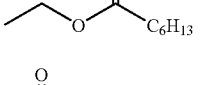 |
| Example compound 34 | VO | α-position | 1 | -n-C₅H₁₁ | 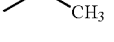 |
| Example compound 35 | Cu | α-position | 3 | 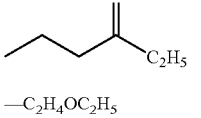 | 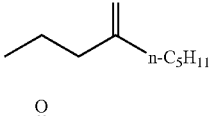 |
| Example compound 36 | Cu | α-position | 2 | —C₂H₄OC₂H₅ | 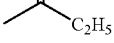 |
| Example compound 37 | Cu | α-position | 4 | -i-C₃H₇ | 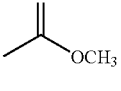 |
| Example compound 38 | Co | α-position | 2 | -i-C₃H₇ | 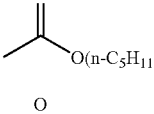 |
| Example compound 39 | VO | α-position | 1 | -i-C₃H₇ | 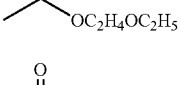 |
| Example compound 40 | Cu | α-position | 4 | 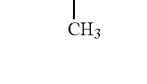 | 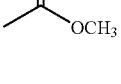 |

-continued

| Example compound No. | M | Substitution position on phthalocyanine ring | n | —R¹ | —R² |
|---|---|---|---|---|---|
| Example compound 41 | AlOH | α-position | 2 | CH(CH₃)₂ (isopropyl-methyl) | —C(O)O(i-C₃H₇) |
| Example compound 42 | Cu | α-position | 3 | CH(CH₃)₂ (isobutyl) | —C(O)OC₂H₅ |
| Example compound 43 | Cu | α-position | 1 | —C(O)CH₂CH₃ with CH₃ | —C(O)OCH₃ |
| Example compound 44 | Cu | α-position | 4 | —C(O)CH₂C₂H₅ | —C(O)OCH₂CH₂-n-C₆H₁₃ |
| Example compound 45 | Cu | β-position | 3 | —C(O)(CH₂)₂CH₃ (pentan-2-one) | —C(O)OCH₂CH₃ with CH₃ |
| Example compound 46 | Cu | α-position | 2 | —CH₂OCH₂-(1,3-dioxolan-2-yl) | —C(O)OC₂H₄OC₂H₅ |
| Example compound 47 | Cu | α-position | 4 | —CH₃ | —C(O)OC₂H₄-(1,3-dioxan-2-yl) |
| Example compound 48 | Cu | α-position | 4 | —CH(OC₂H₅)CH₂CH₂CH₃ | —C(O)OC₂H₅ |
| Example compound 49 | Cu | α-position | 4 | —CH₃ | —CH₂OCH₂-(2,2-dimethyl-1,3-dioxolan-4-yl) |
| Example compound 50 | Co | α-position | 4 | —C(O)CH₂CH₂CH(OC₂H₅) | —C(O)O(n-C₅H₁₁) |
| Example compound 51 | Cu | α-position | 4 | —C(O)CH₂OCH₃ | —C(O)OCH₃ |
| Example compound 52 | Pd | α-position | 2 | —C(O)CH₂CH₂OCH₃ | —C(O)OCH₂-(tetrahydrofuran-2-yl) |
| Example compound 53 | Cu | β-position | 4 | —C(O)CH₂CH₂CH₂OC₂H₅ | —C(O)CH₂CH₂OC₂H₅ |

-continued

| Example compound No. | M | Substitution position on phthalocyanine ring | n | —R¹ | —R² |
|---|---|---|---|---|---|
| Example compound 54 | Cu | α-position | 2 | 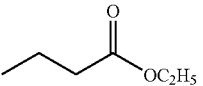 | 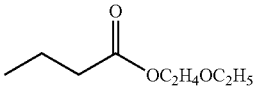 |

In the dye-containing curable composition of the invention, the phthalocyanine compound represented by the general formula (IV) may be used solely or in combination of plural kinds thereof. Furthermore, a known dye may be used in addition to the phthalocyanine compound represented by the general formula (IV).

The known dye may be appropriately selected from organic solvent soluble dyes depending on the necessary spectrum absorption. Examples of species of the dye include an acidic dye, a basic dye, a disperse dye, a reaction product of an acidic dye with a basic compound, and a reaction product of a basic dye with an acidic compound, which is solubilized in an organic solvent. Furthermore, an oil soluble dye may be preferably selected from dyes described in C.I. Solvent Dye.

It is necessary that the dye has a desired spectrum as a color filter, is dissolved in the solvent or the solution containing the alkali soluble resin in a necessary concentration, and does not cause deposition or aggregation with the lapse of time. The dye may be appropriately selected from C.I. Solvent Colors described in Color Index. A dye that has suitable solvent solubility and spectrum may be selected from an oil soluble dye, an acidic dye, a disperse dye, a reactive dye and a direct dye. The solubility of a dye in an organic solvent referred herein means that it is dissolved in a solvent in a concentration of 1% by mass or more.

The content of the dye represented by the general formula (IV) (and the known dye depending on necessity) in the dye-containing curable composition is preferably from 1 to 80% by mass, more preferably from 3 to 50% by mass, and particularly preferably from 5 to 30% by mass, based on the total solid content (by mass) of the composition. It is preferred that the proportion of the dye is smaller from the standpoint of sensitivity and developing property as far as the spectral characteristics are not impaired.

The components (A), (C), (D), (E), and other components will be described in detail.

(A) Alkali Soluble Resin

The alkali soluble resin is preferably a linear organic polymer that is soluble in an organic solvent and developable with a weak alkali aqueous solution. Examples of the linear organic polymer include a polymer having a carboxylic acid on a side chain, such as a methacrylic acid copolymer, an acrylic acid copolymer, an itaconic acid copolymer, a crotonic acid copolymer, a maleic acid copolymer and a partially esterified maleic acid copolymer, described, for example, in JP-A No.59-44615, JP-B Nos. 54-34327, 58-12577 and 54-25957, and JP-A Nos. 59-53836 and 59-71048, and also, an acidic cellulose derivative having a carboxylic acid on a side chain is useful.

In addition to the foregoing, a polymer obtained by adding an acid anhydride to a polymer having a hydroxyl group, a polyhydroxystyrene resin, a polysiloxane resin, poly(2-hydroxyethyl(meth)acrylate), polyvinylpyrrolidone, polyethyleneoxide and polyvinyl alcohol are also useful.

A monomer having a hydrophilic group may be copolymerized, and examples thereof include alkoxyalkyl(meth) acrylate, hydroxyalkyl(meth)acrylate, glycerol(meth)acrylate, (meth)acrylamide, N-methylolacrylamide, secondary or tertiary alkylacrylamide, dialkylaminoalkyl(meth)acrylate, morpholine(meth)acrylate, N-vinylpyrrolidone, N-vinylcaprolactam, vinylimidazole, vinyltriazole, methyl (meth)acrylate, ethyl(meth)acrylate, branched or linear propyl(meth)acrylate, branched or linear butyl(meth)acrylate and phenoxyhydroxypropyl(meth)acrylate.

Furthermore, a monomer having a tetrahydrofurfuryl group, phosphoric acid, a phosphate ester, a quaternary ammonium salt, an ethyleneoxy chain, a propyleneoxy chain, sulfonic acid or a salt thereof, or a morpholinoethyl group is also useful as the monomer having a hydrophilic group.

A polymerizable group may be present on the side chain thereof for improving the crosslinking efficiency, and a polymer having an allyl group, a (meth)acryl group or an allyloxyalkyl group is also useful. In order to improve the strength of the cured film, alcohol soluble nylon and a polyether of 2,2-bis(4-hydroxyphenyl)propane and epichlorohydrin are useful.

Among these various kinds of alkali soluble resins, a polyhydroxystyrene resin, a polysiloxane resin, an acrylic resin, an acrylamide resin and an acrylic-acrylamide copolymer resin are preferred from the standpoint of heat resistance, and an acrylic resin, an acrylamide resin and an acrylic/acrylamide copolymer resin are preferred from the standpoint of controllability of developing property.

Examples of the acrylic resin include a copolymer of a monomer selected from benzyl(meth)acrylate, (meth)acrylic acid, hydroxyethyl(meth)acrylate, (meth)acrylamide and ally(meth)acrylate.

An alkali soluble phenol resin is also useful. Examples of an alkali soluble resin having a phenolic hydroxyl group include a polyhydroxystyrene resin. Specific examples thereof include a p-hydroxystyrene resin, a m-hydroxystyrene resin, an o-hydroxystyrene resin, a copolymer thereof, a copolymer of hydroxystyrene and styrene, a copolymer of hydroxystyrene and acetoxystyrene, and a copolymer of hydroxystyrene and the aforementioned (meth)acrylic monomer.

A novolak resin and a vinyl polymer are also exemplified.

Examples of the novolak resin include those obtained by condensing a phenol compound and an aldehyde compound in the presence of an acid catalyst. Examples of the phenol compound include phenol, cresol, ethylphenol, propylphenol, butylphenol, xylenol, phenylphenol, catechol, resorcinol, pyrogallol, naphthol and bisphenol A. These phenol compounds may be used solely or in combination of two or more kinds of them. Examples of the aldehyde compound include formaldehyde, paraformaldehyde, acetaldehyde, propionaldehyde and benzaldehyde.

Specific examples of the novolak resin include a condensed product of m-cresol, p-cresol or a mixture thereof with formalin.

The alkali soluble resin is preferably a polymer having a number average molecular weight Mn (polystyrene conversion value measured with GPC) of 1,000 to $2\times10^5$, more preferably a polymer having Mn of 2,000 to $1\times10^5$, and particularly preferably a polymer having Mn of 4,000 to $5\times10^4$.

The molecular weight distribution (weight average molecular weight Mw/number average molecular weight Mn) of the alkali soluble resin is preferably from 1.6 to 1.05, and more preferably from 1.4 to 1.1 for maintaining a rectangular shape of an image profile after development. In order to obtain a molecular weight distribution in the aforementioned range, it is preferred that a resin having a narrow molecular weight distribution is directly obtained by a known polymerization method (such as a living anion polymerization, a living cation polymerization and a living radical polymerization), and such a method may also be applied as a solvent fractionation method (a resin is dissolved in a good solvent and then mixed with a poor solvent to deposit only a high molecular weight component, so as to obtain a resin having a narrow molecular weight distribution), a molecular weight fractionation method using column chromatography, and a fractionation method using a supercritical fluid.

The content of the alkali soluble resin in the dye-containing curable resin is preferably from 10 to 90% by mass, more preferably from 20 to 80% by mass, and particularly preferably from 30 to 70% by mass, based on the total solid content (by mass) of the composition.

(C) Photosensitive Compound

The photosensitive compound in the invention is preferably a naphthoquinonediazide compound in the case where the dye-containing curable composition is constituted as a positive type, and is preferably a photopolymerization initiator in the case where the composition is constituted as a negative type.

(Naphthoquinonediazide Compound)

In the case where a positive dye-containing curable composition, a naphthoquinonediazide compound sensitive to g-line and i-line used as a photoresist for a semiconductor is preferred. Examples of the naphthoquinonediazide compound include o-naphthoquinonediazide-5-sulfonic acid ester, o-naphthoquinonediazide-5-sulfonic acid amide, o-naphthoquinonediazide-4-sulfonic acid ester and o-naphthoquinonediazide-4-sulfonic acid amide. These esters and amides can be produced, for example, by using a phenol compound described as the general formula (I) in JP-A Nos. 2-84650 and 3-49437.

The phenol compound preferably has at least two, more preferably three or more, phenolic hydroxyl groups in one molecule from the standpoint of fulfillment of sufficient resistance to an alkali developer before exposure and high developing property after exposure. Furthermore, it is preferred for improvement in sensitivity and solubility in solvents that all the hydroxyl groups in the molecule are not converted to naphthoquinonediazide sulfonic acid esters, but a part of the hydroxyl groups are left as it is.

The alkali soluble resin and the naphthoquinonediazide compound are generally dissolved in a solvent in a proportion of 2 to 35% by mass based on the mass of the solvent.

(Photopolymerization Initiator)

In the case where a negative dye-containing curable composition is constituted, a photopolymerization initiator is an essential component. The polymerization initiator may also be further added to the positive type containing the naphthoquinonediazide compound, and in this case, the curing degree of a pattern thus formed can be accelerated after the formation of the pattern.

The photopolymerization initiator is not particularly limited as far as it can initiate a crosslinking reaction of a crosslinking agent or a polymerization reaction through exposure, and is preferably selected from the standpoint of characteristics, initiation efficiency, absorption wavelength, availability, cost and safety. Examples thereof include at least one active halogen compound selected from a halomethyloxadiazole compound and a halomethyl-s-triazine compound, a 3-aryl-substituted coumarin compound, a lophine dimer, a benzophenone compound, an acetophenone compound and a derivative thereof, a cyclopentadiene-benzene-iron complex and a salt thereof, and an oxime compound.

Examples of the active halogen compound as the halomethyloxadiazole compound include 2-halomethyl-5-vinyl-1, 3,4-oxadiazole compound described in JP-B No. 57-6096, 2-trichloromethyl-5-styryl-1,3,4-oxadiazole, 2-trichloromethyl- 5-(p-cyanostyryl)-1,3,4-oxadiazole and 2-trichloromethyl-5-(p-methoxystyryl)-1,3,4-oxadiazole.

Examples of the active halogen compound as the halomethyl-s-triazine compound include a vinylhalomethyl-s-triazine compound described in JP-B No. 59-1281, and a 2-(naphtho-1-yl)-4,6-bishalomethyl-s-triazine compound and a 4-(p-aminophenyl)-2,6-dihalomethyl-s-triazine compound described in JP-A No. 53-133428.

Specific examples thereof include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bistrichloromethyl-s-triazine, 2-(4-methoxynaphto-1-yl)-4,6-bistrichloromethyl-s-triazine, 2-(4-ethoxynaphtho-1-yl)-4,6-bistrichloromethyl-s-triazine, 2-(4-butoxynaphtho-1-yl)-4,6-bistrichloromethyl-s-triazine, 2-(4-(2-methoxyethyl)-napto-1-yl)-4,6-bistrichloromethyl-s-triazine, 2-(4-(2-ethoxyethyl)-naphtho-1-yl)-4,6-bistrichloromethyl-s-triazine, 2-(4-(2-butoxyethyl)-naphtho-1-yl)-4,6-bistrichloromethyl-s-triazine, 2-(2-methoxynaphtho-2-yl)-4,6-bistrichloromethyl-s-triazine, 2-(6-methoxy-5-methylnaphtho-2-yl)-4,6-bistrichloromethyl-s-triazine, 2-(6-methoxynaphtho-2-yl)-4,6-bistrichloromethyl-s-triazine, 2-(5-methoxynaphtho-1-yl)-4,6-bistrichloromethyl-s-triazine, 2-(4,7-dimethoxynaphtho-1-yl)-4,6-bistrichloromethyl-s-triazine, 2-(6-ethoxynaphtho-2-yl)-4,6-bistrichloromethyl-s-triazine, 2-(4,5-dimethoxynaphtho-1-yl)-4,6-bistrichloromethyl-s-triazine, 4-(p-N,N-di(ethoxycarbonylmethyl)aminophenyl)-2,6-di(trichloromethyl)-s-triazine, 4-(o-methyl-p-N,N-di(ethoxycarbonylmethyl)aminophenyl)-2,6-di(trichloromethyl)-s-triazine, 4-(p-N,N-di(chloroethyl)aminophenyl)-2,6-di(trichloromethyl)-s-triazine, 4-(o-methyl-p-N,N-di(chloroethyl)aminophenyl)-2,6-di(trichloromethyl)-s-triazine, 4-(p-N-chloroethylaminophenyl)-2,6-di(trichloromethyl)-s-triazine, 4-(p-N-ethoxycabonylmethylaminophenyl)-2,6-di(trichloromethyl)-s-triazine, 4-(p-N,N-di(phenyl)aminophenyl)-2,6-di(trichloroemthyl)-s-triazine, 4-(p-N-chloroethylcarbonylaminophenyl)-2,6-di(trichloromethyl)-s-triazine, 4-(p-N-(p-methoxyphenyl)carbonylaminophenyl)-2,6-di(trichloromethyl)-s-triazine, 4-(m-N,N-di(ethoxycarbonylmethyl)aminophenyl)-2,6-di(trichloromethyl)-s-triazine, 4-(m-bromo-p-N,N-di(ethoxycarbonylmethyl)aminophenyl)-2,6-di(trichloromethyl)-s-triazine, 4-(m-chloro-p-N,N-di(ethoxycarbonylmethyl)aminophenyl)-2,6-di(trichloromethyl)-s-triazine, 4-(m-fluoro-p-N,N-di(ethoxycarbonylmethyl)aminophenyl)-2,6-di(trichloromethyl)-s-triazine, 4-(o-bromo-p-N,N-di(ethoxycarbonylmethyl)aminophenyl)-2,6-di(trichloromethyl)-s-triazine, 4-(o-chloro-p-N,N-di(ethoxycarbonylmethyl)aminophenyl)-2,6-di (trichloromethyl)-s-triazine, 4-(o-fluoro-p-N,N-di(ethoxycarbonylmethyl)aminophenyl-2,6-di(trichloromethyl)-s-triazine, 4-(o-bromo-p-N,N-di(chloroethyl)aminophenyl-2,6-di(trichloromethyl)-s-triazine, 4-(o-chloro-p-N,N-di(chloroethyl)aminophenyl)-2,6-di(trichloromethyl)-s-triazine, 4-(o-fluoro-p-N,N-di(chloroethyl)aminophenyl)-2,6-di(trichloromethyl)-s-triazine, 4-(m-bromo-p-N,N-di(chloroethyl)aminophenyl)-2,6-di(trichloromethyl)-s-triazine, 4-(m-chloro-p-N,N-di(chloroethyl)aminophenyl)-2,6-di(trichloromethyl)-s-triazine, 4-(m-fluoro-p-N,N-di(chloroethyl)aminophenyl)-2,6-di(trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di(trichloromethyl)-s-triazine, 4-(o-fluoro-p-N-ethoxycarbonylmethylaminophenyl)-2,6-di(trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di(trichloromethyl)-s-triazine and 4-(o-fluoro-p-N-chloroethylaminophenyl)-2,6-di(trichloromethyl)-s-triazine.

Also usefully used include TAZ series (such as TAZ-104, TAZ-107, TAZ-109, TAZ-110, TAZ-113, TAZ-123, TAZ-140 and TAZ-204), produced by Midori Kagaku Co., Ltd., T series (such as T-OMS, T-BMP, T-R and T-B), produced by PANCHIM, Inc., IRGACURE series (such as IRGACURE 149, IRGACURE 184, IRGACURE 261, IRGACURE 500, IRGACURE 651, IRGACURE 819 and IRGACURE 1000) and DAROCURE series (such as DAROCURE 1173), produced by Ciba-Geigy Ltd., 4,4'-bis(diethylamino)-benzophenone, 2-(O-benzoyloxime)-1-(4-(phenylthio)phenyl)-1,2-octadione, 2-benzyl-2-dimethylamino-4-morpholinobutylophenone, 2,2-dimethoxy-2-phenylacetophenone, a 2-(o-chlorophenyl)-4,5-diphenylimidazolyl dimer, a 2-(o-fluorophenyl)-4,5-diphenylimidazolyl dimer, a 2-(o-methoxyphenyl)-4,5-diphenylimidazolyl dimer, a 2-(p-methoxyphenyl)-4,5-diphenylimidazolyl dimer, a 2-(p-dimethoxyphenyl)-4,5-diphenylimidazolyl dimer, a 2-(2,4-dimethoxyphenyl)-4,5-diphenylimidazolyl dimer, a 2-(p-methylmercaptophenyl)-4,5-diphenylimidazolyl dimer and benzoin isopropyl ether.

The photopolymerization initiator may be used in combination with a sensitizer and a photostabilizer.

Examples thereof include benzoin, benzoin methyl ether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acridone, 10-butyl-2-chloroacridone, benzyl, dibenzylacetone, p-(dimethylamino) phenylstyryl ketone, p-(dimethylamino)phenyl-p-methyl styryl ketone, benzophenone, p-(dimethylamino)benzophenone (or Michler's ketone), p-(diethylamino)benzophenone, benzoanthrone, a benzothiazole compound described in JP-B No. 51-48516, and TINUVIN 1130 and TINUVIN 400.

In the dye-containing curable composition of the invention, another known initiator may be contained in addition to the aforementioned photopolymerization initiator. Specific examples thereof include a vicinal polyketaldonyl compound described in U.S. Pat. No. 2,367,660, α-carbonyl compounds described in U.S. Pat. Nos. 2,367,661 and 2,367,670, an acyloin ether described in U.S. Pat. No. 2,448,828, an aromatic acyloin compound substituted with an α-hydrocarbon described in U.S. Pat. No. 2,722,512, a multinuclear quinone compound described in U.S. Pat. No. 2,951,758, a combination of a triallylimidazole dimer and p-aminophenyl ketone described in U.S. Pat. No. 3,549,367, and a benzothiazole compound and a trihalomethyl-s-triazine compound described in JP-B No. 51-48516.

The total content of the photopolymerization initiator (and the known initiator) is preferably from 0.01 to 50% by mass, more preferably from 1 to 30% by mass, and particularly preferably from 1 to 20% by mass, based on the solid content (by mass) of the polymerizable monomer components (for example, a polymerizable monomer compound indicated as a crosslinking agent described later). If the total content thereof is less than 0.01% by mass, the polymerization may be difficult to proceed, and if it exceeds 50% by mass, the molecular weight may become small to reduce the film strength although the polymerization rate is large.

(D) Solvent

Upon preparation of the dye-containing curable composition of the invention, a solvent is generally used. The solvent is not particularly limited as far as it satisfies solubility to the respective components and coating property of the dye-containing curable composition, and it is preferably selected under particular consideration of the solubility of the alkali soluble resin, the coating property and the safety.

Preferred examples of the solvent include an ester compound, such as an alkyl ester, e.g., ethyl acetate, n-butyl acetate, isobutyl acetate, amyl formate, isoamyl acetate, isobutyl acetate, butyl propionate, isopropyl butyrate, ethyl butyrate, butyl butyrate, an alkyl ester compound, methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate and ethyl ethoxyacetate; a 3-oxypropionic acid alkyl ester, such as methyl 3-oxypropionate and ethyl 3-oxypropionate, for example, methyl 3-methoxypropionate, ethyl 3-methoxypropionate, methyl 3-ethoxypropionate and ethyl 3-ethoxypropionate, a 2-oxypropionic acid alkyl ester, such as methyl 2-oxypropionate, ethyl 2-oxypropionate and propyl 2-oxypropionate, for example, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate and ethyl 2-ethoxy-2-methylpropionate, methylpyruvate, ethyl pyruvate, propyl pyruvate, methyl acetoacetate, ethyl acetoacetate, methyl 2-oxobutanoate and ethyl 2-oxobutanoate; an ether compound, such as diethylene glycol dimethyl ether, tetrahydrofuran, ethylene glycol monomethyl ether, ethylene glycol monoethyl ether, methylcellosolve acetate, ethylcellosolve acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, propylene glycol propyl ether acetate, ethylcarbitol acetate and butylcarbitol acetate; a ketone compound, such as methyl ethyl ketone, cyclohexanone, 2-heptanone and 3-heptanone, and an aromatic hydrocarbon compound, such as toluene and xylene.

Among these, methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether and propylene glycol methyl ether acetate are more preferred.

Two or more kinds of the solvents may be mixed from the standpoint of solubility of the dye and the alkali soluble resin and improvement of the surface property of the coated film, and in particular, such a mixed solvent is preferably used that is constituted with two or more kinds selected from methyl 3-ethoxypropionate, ethyl 3-ethoxypropionate, ethylcellosolve acetate, ethyl lactate, diethylene glycol dimethyl ether, butyl acetate, methyl 3-methoxypropionate, 2-heptanone, cyclohexanone, ethylcarbitol acetate, butylcarbitol acetate, propylene glycol methyl ether and propylene glycol methyl ether acetate.

(E) Crosslinking Agent

The crosslinking agent is activated with an acid or a radical generated from the photopolymerization initiator through irradiation of light or a radiation ray, whereby crosslinking is formed by reacting with the alkali soluble resin, or crosslinking is formed by bonding or polymerization of the crosslinking agent itself, and thus, the solubility of the alkali developer in an exposed area is lowered to form an image. Furthermore, the crosslinking agent is effective for sufficient curing of a pattern by heating after forming an image depending on necessity.

Therefore, the crosslinking agent used in the invention is not particularly limited as far as it is capable of exerting film curing through crosslinking and polymerization, and examples thereof include (a) an epoxy resin, (b) a melamine compound, a guanamine compound, a glycoluril compound or an urea compound having been substituted with at least one substituent selected from a methylol group, an alkoxymethyl group and an acyloxymethyl group, (c) a phenol compound, a naphthol compound or a hydroxyanthracene compound having been substituted with at least one substituent selected from a methylol group, an alkoxymethyl group and an acyloxymethyl group, and (d) a polymerizable monomer compound.

The epoxy resin (a) may be any compound that has an epoxy group and crosslinking property, and examples thereof include a divalent glycidyl group-containing low molecular weight compound, such as bisphenol A glycidyl ether, ethylene glycol diglycidyl ether, butanediol diglycidyl ether, hexanediol diglycidyl ether, dihydroxybiphenyl diglycidyl ether, diglycidyl phthalate and N,N-diglycidylaniline, a trivalent glycidyl group-containing low molecular weight compound, such as trimethylolpropane triglycidyl ether, trimethylolphenol triglycidyl ether and TrisP-PA (trisphenol P-PA) triglycidyl ether, a tetravalent glycidyl group-containing low molecular weight compound, such as pentaerythritol tetraglycidyl ether and tetramethylolbisphenol A tetraglycidyl ether, a polyvalent glycidyl group-containing low molecular weight compound, such as dipentaerythritol pentaglycidyl ether and dipentaerythritol hexaglycidyl ether, and a glycidyl group-containing polymer compound, such as polyglycidyl(meth)acrylate and a 1,2-epoxy-4-(2-oxiranyl)cyclohexane adduct of 2,2-bis(hydroxymethyl)-1-butanol.

The number of a methylol group, an alkoxymethyl group and an acyloxymethyl group contained in and substituted on the crosslinking agent (b) is generally from 2 to 6 in the case of the melamine compound and from 2 to 4 in the case of the glycoluril compound, the guanamine compound and the urea compound, and is preferably from 5 to 6 in the case of the melamine compound and from 3 to 4 in the case of the glycoluril compound, the guanamine compound and the urea compound.

The melamine compound, the guanamine compound, the glycoluril compound and the urea compound (b) are referred to as a compound (a methylol group-containing compound, an alkoxymethyl group-containing compound or an acyloxymethyl group-containing compound) of the category (b).

The methylol group-containing compound of the category (b) can be obtained by heating an alkoxymethyl group-containing compound in an alcohol in the presence of an acid catalyst, such as hydrochloric acid, sulfuric acid, nitric acid and methanesulfonic acid. The acyloxymethyl group-containing compound of the category (b) can be obtained by mixing and stirring a methylol group-containing compound with an acyl chloride in the presence of a basic catalyst.

Specific examples of the compounds of the category (b) having the aforementioned substituent are shown below.

Examples of the melamine compound include hexamethylolmelamine, hexamethoxymethylmelamine, a compound obtained by methoxymethylating from 1 to 5 methylol groups of hexamethylolmelamine or a mixture thereof, hexamethoxyethylmelamine, hexaacyloxymethylmelamine, and a compound obtained by acyloxymethlating from 1 to 5 methylol groups of hexamethylolmelamine or a mixture thereof.

Examples of the guanamine compound include tetramethylolguanamine, tetramethoxymethylguanamine, a compound obtained by methoxymethylating from 1 to 3 methylol groups of tetramethylolguanamine or a mixture thereof, tetramethoxyethylguanamine, tetraacyloxymethylguanamine, and a compound obtained by acyloxymethylating from 1 to 3 methylol groups of tetramethylolguanamine or a mixture thereof.

Examples of the glycoluril compound include tetramethylolglycoluril, tetramethoxymethylglycoluril, a compound obtained by methoxymethylating from 1 to 3 methylol groups of tetramethylolglycoluril or a mixture thereof, and a compound obtained by acyloxymethylating from 1 to 3 methylol groups of tetramethylolglycoluril or a mixture thereof.

Examples of the urea compound include tetramethylolurea, tetramethoxymethylurea, a compound obtained by methoxymethylating from 1 to 3 methylol groups of tetramethylolurea or a mixture thereof, and tetramethoxyethylurea.

The compounds of the category (b) may be used solely or in combination thereof.

The crosslinking agent (c), i.e., a phenol compound, a naphthol compound or a hydroxyanthracene compound having been substituted with at least one substituent selected from a methylol group, an alkoxymethyl group and an acyloxymethyl group, exerts thermal crosslinking as similar to the crosslinking agent (b), so as to suppress intermixing with a photoresist as an upper layer and to improve the film strength. These compounds are sometimes referred to as a compound of the category (c) (a methylol group-containing compound, an alkoxymethyl group-containing compound or an acyloxymethyl group-containing compound).

The number of a methylol group, an alkoxymethyl group and an acyloxymethyl group contained in the crosslinking agent (c) is necessarily at least 2 per one molecule, and a compound having a phenol compound skeleton, all the 2-position and the 4-position of which have been substituted, is preferred from the standpoint of thermal crosslinking property and storage stability. Furthermore, a compound having a naphthol compound skeleton or a hydroxyanthracene compound skeleton, all the o-positions and the p-positions of which with respect to the hydroxyl group have been substituted, is also preferred. The 3-position or the 5-position of the phenol compound may either be unsubstituted or have a substituent, and in the naphthol compound, other positions than the o-positions with respect to the hydroxyl group may either be unsubstituted or have a substituent.

The methylol group-containing compound of the category (c) can be obtained by using a phenolic hydroxyl group-containing compound whose 2- or 4-position of the phenolic hydroxyl group is a hydrogen atom as a raw material and reacting it with formalin in the presence of a basic catalyst, such as sodium hydroxide, potassium hydroxide, ammonia and tetraalkylammonium hydroxide. The alkoxymethyl group-containing compound of the category (c) can be obtained by heating the methylol group-containing compound of the category (c) in an alcohol in the presence of an acid catalyst, such as hydrochloric acid, sulfuric acid, nitric acid and methanesulfonic acid. The acyloxymethyl group-containing compound of the category (c) can be obtained by reacting the methylol group-containing compound of the category (c) with an acyl chloride in the presence of a basic catalyst.

Examples of the skeleton compound of the crosslinking agent (c) include a phenol compound, a naphthol compound and a hydroxyanthracene compound, in which the o-positions and the p-positions of the phenolic hydroxyl group are unsubstituted, and examples thereof include phenol, isomers of cresol, 2,3-xylenol, 2,5-xylenol, 3,4-xylenol, 3,5-xylenol, a bisphenol compound, such as bisphenol A, 4,4'-bishydroxybiphenyl, TrisP-PA (produced by Honshu Chemical Industry Co., Ltd.), naphthol, dihydroxynaphthalene and 2,7-dihydroxyanthracene.

As specific examples of the crosslinking agent (c), examples of the phenol compound include trimethylolphenol, tri(methoxymethyl)phenol, a compound obtained by methoxymethylating from 1 to 2 methylol groups of trimethylolphenol, trimethylol-3-cresol, tri(methoxymethyl)-3-cresol, a compound obtained by methoxymethylating from 1 to 2 methylol groups of trimethylol-3-cresol, a dimethylolcresol, such as 2,6-dimethylol-4-cresol, tetramethylolbisophenol A, tetramethoxymethylbisphenol A, a compound obtained by methoxymethlating from 1 to 3 methylol groups of tetramethylolbisphenol A, tetramethylol-4,4'-bishydroxybiphenyl, tetramethoxymethyl-4,4'-bishydroxybiphenyl, a hexamethylol compound of TrisP-PA, a hexamethoxymethyl compound of TrisP-PA, a compound obtained by methoxymethylating from 1 to 5 methylol groups of a hexamethylol compound of TrisP-PA, and bishydroxymethylnaphthalenediol.

Examples of the hydroxyanthracene compound include 1,6-dihydroxymethyl-2,7-dihydroxyanthracene, and examples of the acyloxymethyl group-containing compound include compounds obtained by acyloxymethylating a part or all of the methylol groups of the methylol group-containing compounds.

Preferred examples among these compounds include trimethylolphenol, bishydroxymethyl-p-cre sol, tetramethylolbisphenol A, a hexamethylol compound of TrisP-PA (produced by Honshu Chemical Industry Co., Ltd.), and phenol compounds obtained by substituting the methylol groups of these compounds with an alkoxymethyl group and both a methylol group and an alkoxymethyl group.

The compound of the category (c) may be used solely or in combination thereof.

The polymerizable monomer (d) will be described below. As the polymerizable monomer, such a compound is preferred that has at least one addition-polymerizable ethylene group and has a boiling point of 100° C. or more under ordinary pressure and an ethylenic unsaturated group.

Examples thereof include a monofunctional acrylate or methacrylate, such as polyethylene glycol mono(meth)acrylate, polypropylene glycol mono(meth)acrylate and phenoxyethyl(meth)acrylate, and a polyfunctional acrylate or methacrylate, such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol hexa(meth)acrylate, hexanediol(meth)acrylate, trimethylolpropane tri(acryloyloxypropyl) ether, tri(acryloyloxyethyl)isocyanurate, a compound obtained by adding ethylene oxide or propylene oxide to a polyhydric alcohol, such as glycerin and trimethylolethane, and then converted to a (meth)acrylate, urethane acrylate compounds described in JP-B Nos. 48-41708 and 50-6034 and JP-A No. 51-37193, polyester acrylate compounds described in JP-A No. 48-64183 and JP-B Nos. 49-43191 and 52-30490, and an epoxy acrylate compound, which is a reaction product of an epoxy resin and (meth)acrylic acid. Examples thereof further include compounds indicated as a photocurable monomer and oligomer in Journal of Adhesion Society of Japan, Vol. 20, No. 7, p. 300 to 308.

The total content of the crosslinking agents (a) to (d) in the dye-containing curable composition is, while it varies depending on the material thereof, preferably from 1 to 70% by mass, more preferably from 5 to 50% by mass, and particularly preferably from 7 to 30% by mass, based on the solid content of the composition.

(F) Other Components (Thermal Polymerization Inhibitor)

A thermal polymerization inhibitor is preferably contained in the dye-containing curable composition of the invention in addition to the aforementioned components. Examples thereof include hydroquinone, p-methoxypehnol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol) and 2-mercaptobeozimidazole.

(Various Kinds of Additives)

Various kinds of additives may be added to the dye-containing curable composition of the invention depending on necessity, such as a filler, a polymer compound other than those described in the foregoing, a surfactant, an adhesion accelerating agent, an antioxidant, an ultraviolet ray absorbing agent and an aggregation preventing agent. Furthermore, a discoloration preventing agent for the dye may also be added depending on necessity.

Examples of the additives include a filler, such as glass and alumina; a polymer compound other than the binder resin, such as polyvinyl alcohol, polyacrylic acid, polyethylene glycol monoalkyl ether and polyfluoroalkyl acrylate; a surfactant, such as a nonionic surfactant, a cationic surfactant and an anionic surfactant; an adhesion accelerating agent, such as vinyltrimethoxysilane, vinyltriethoxysilane, vinyltris(2-methoxyethoxy) silane, N-(2-amonoethyl)-3-aminopropyldimethylmethoxysilane, N-(2-aminoethyl)-3-aminopropyltrimethyoxysilane, 3-aminopropyltriethoxysilane, 3-glycidoxypropyltrimethoxysilane, 3-glycidoxypropylmethyldimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane and 3-mercaptopropyltrimethoxysilane; an antioxidant, such as 2,2-thiobis(4-methyl-6-t-butylphenol) and 2,6-di-t-butylphenol; an ultraviolet ray absorbing agent, such as 2-(3-t-butyl-5-methyl-2-hydroxyphenyl)-5-chlorobenzotriazole and alkoxybenzophenone; and an aggregation preventing agent, such as sodium polyacrylate.

In order to accelerate the dissolution of the non-image area to an alkali solution to attain further improvement of the developing property of the dye-containing curable composition of the invention, an organic carboxylic acid, preferably a low molecular weight organic carboxylic acid having a molecular weight of 1,000 or less, may be added to the composition.

Specific examples thereof include an aliphatic monocarboxylic acid, such as formic acid, acetic acid, propionic acid, butyric acid, valeric acid, pivalic acid, caproic acid, diethylacetic acid, enanthic acid and caprylic acid; an aliphatic dicarboxylic acid, such as oxalic acid, malonic acid, succinic acid, glutaric acid, adipic acid, pimelic acid, suberic acid, azelaic acid, sebacic acid, brassylic acid, methylmalonic acid, ethylmalonic acid, dimethylmalonic acid, methylsuccinic acid, tetramethylsuccinic acid and citraconic acid; an aliphatic tricarboxylic acid, such as tricarballylic acid, aconitic acid and camphoronic acid; an aromatic monocarboxylic acid, such as benzoic acid, toluic acid, cuminic acid, hemellitic acid and mesitylenic acid; an aromatic polycarboxylic acid, such as phthalic acid, isophthalic acid, terephthalic acid, trimellitic acid, trimesic acid, mellophanic acid and pyromellitic acid; and other carboxylic acids, such as phenylacetic acid, hydratropic acid, hydrocinnamic acid, mandelic acid, phenylsuccinic acid, atropic acid, cinnamic acid, methyl cinnamate, benzyl cinnamate, cinnamylideneacetic acid, coumaric acid and umbellic acid.

The dye-containing curable composition of the invention can be preferably used for forming colored pixels of a color filter used for a liquid crystal display device and a solid state image sensing device (such as CCD and CMOS), and for producing a printing ink, an ink for ink-jet printing and a paint.

<Color Filter and Process for Producing the Color Filter>

The color filter of the invention will be described in detail with reference to the production process thereof.

In the process for producing a color filter according to the invention, a color filter can be produced by using the composition containing at least the alkali soluble resin (A) and the phthalocyanine compound (dye) (B) represented by the general formula (I) or (IV), and preferably by using the dye-containing curable composition according to the invention. Accordingly, the color filter of the invention contains the alkali soluble resin (A) and the phthalocyanine compound (dye) (B) represented by the general formula (I) or (IV), and can be constituted by using the same components as in the dye-containing curable composition of the invention as described in the foregoing.

In the case where the dye-containing curable composition of the invention is constituted as a negative type, the negative dye-containing curable composition is coated on a support by a coating method, such as spin coating, flow coating and roll coating, to form a radiation sensitive composition layer, which is then exposed through a prescribed mask pattern, followed by being developed with a developer, to form a negative colored pattern (image forming step). The process may further contain, depending on necessity, a curing step for curing the thus formed colored pattern by heating and/or exposure.

In the case where the dye-containing curable composition of the invention is constituted as a positive type, the positive dye-containing curable composition is coated on a support by a coating method, such as spin coating, flow coating and roll coating, to form a radiation sensitive composition layer, which is then exposed through a prescribed mask pattern, followed by being developed with a developer, to form a positive colored pattern (image forming step). Thereafter, thus formed colored pattern is cured by heating (post-baking step).

Upon production of a color filter, a color filter having prescribed hues can be produced by repeating, in the number of the hues, the image forming step (and the curing step depending on necessity) in the case of the negative type, or by repeating, in the number of the hues, the image forming step and the post-baking step in the case of the positive type.

As light or a radiation used herein, an ultraviolet ray, such as g-line, h-line and i-line, is particularly preferably used.

Examples of the support include soda glass, PYREX™ (R) glass and quartz glass, which are used in a liquid crystal display device or the like, those having a transparent electroconductive film adhered, and a photoelectric conversion element substrate, such as a silicon substrate, and a complementary metallic oxide semiconductor (CMOS), which are used in a solid state image sensing device or the like. There are some cases where black stripes for separating pixels are formed on the support.

An undercoating layer may be provided, depending on necessity, on the support for improvement of adhesion to the upper layer, prevention of diffusion of substances, and planarization of the surface of the substrate.

The developer may be any one that has such a formulation that dissolves an uncured part of the dye-containing curable composition of the invention but does not dissolve a cured part thereof. Specific examples thereof include a combination of various kinds of organic solvents and an alkali aqueous solution. Examples of the organic solvent include those having been described for preparation of the dye-containing curable composition of the invention.

Preferred examples of the alkali aqueous solution include alkali aqueous solutions obtained by dissolving such an alkali compound to a concentration of 0.001 to 10% by mass, and preferably from 0.01 to 1% by mass, as sodium hydroxide, potassium hydroxide, sodium carbonate, sodium silicate, sodium metasilicate, aqueous ammonia, ethylamine, diethylamine, dimethylmethanolamine, tetramethylammonium hydroxide, tetraethylammonium hydroxide, choline, pyrrole, piperidine and 1,8-diazabicyclo-(5.4.0)-7-undecene. In the case where a developer containing the alkali aqueous solution is used, the layer thus developed is generally washed with water.

The color filter according to the invention is suitable for a liquid crystal display device and a solid state image sensing device, and particularly suitable for CCD, a CMOS device and an electroluminescence device of high resolution exceeding 1,000,000 pixels. The color filter according to the invention can be used, for example, as such a color filter that is disposed between light accepting parts of pixels and microlenses for light condensation, which constitute CCD.

Specific embodiments for attaining the objects of the invention are shown below.

A first embodiment of the invention is a dye-containing curable composition containing: an alkali soluble resin, a dye, and a photosensitive compound, the dye being a phthalocyanine compound represented by the following general formula (I):

$$M\text{-Pc-}(Y)_l \qquad \text{General Formula (I)}$$

wherein M represents a metallic atom, a metallic oxide, a metallic chloride or a hydrogen atom; Pc represents a phthalocyanine skeleton; Y represents a fluorine-substituted alkoxy group; and l denotes an integer from 1 to 8.

A second embodiment of the invention is a dye-containing curable composition of the first embodiment, wherein Y represents the following general formula (II); M represents a cobalt atom; and l denotes 4:

$$-\text{O}-(CH_2)_m(CF_2)_n X \qquad \text{General Formula (II)}$$

wherein X represents a hydrogen atom or a fluorine atom; m denotes an integer from 1 to 6; and n denotes an integer from 1 to 8.

A third embodiment of the invention is a dye-containing curable composition of the second embodiment, wherein the phthalocyanine compound is an α-tetra(fluoroalkoxy)-substituted phthalocyanine compound, in which a substitution position of Y is an α-position of the phthalocyanine skeleton represented by Pc; m denotes 1 or 2; and n denotes an integer from 3 to 5.

A fourth embodiment of the invention is a dye-containing curable composition of one of the first to third embodiments, wherein the photosensitive compound is a naphthoquinonediazide compound.

A fifth embodiment of the invention is a dye-containing curable composition of the fourth embodiment, further containing a crosslinking agent.

A sixth embodiment of the invention is a dye-containing curable composition of one of the first to third embodiments, wherein the photosensitive compound is a photopolymerization initiator, and the dye-containing curable composition further contains a crosslinking agent. This dye-containing curable composition is the negative type.

A seventh aspect of the invention is a color filter containing a dye-containing curable composition of one of the first to sixth embodiments.

An eighth embodiment of the invention is a process for producing a color filter containing steps of coating the dye-containing curable composition of one of the first to sixth embodiments on a support; exposing the coated composition through a mask; and developing the exposed composition to form a pattern.

A ninth embodiment of the invention is a dye-containing curable composition containing: an alkali soluble resin, a dye, and a photosensitive compound, the dye being a phthalocyanine compound represented by the following general formula (IV):

General Formula (IV)

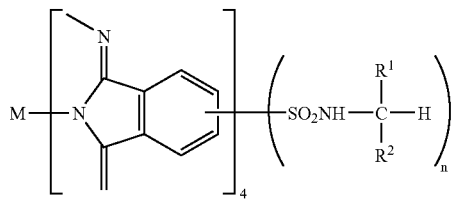

wherein $R^1$ and $R^2$ each independently represent an unsubstituted alkyl group, a substituted alkyl group substituted with a group containing an oxygen atom as an ether bond, a carbonyl bond or an ester bond, an alkylcarbonyl group or an alkoxycarbonyl group, provided that at least one of $R^1$ and $R^2$ represents a substituted alkyl group substituted with a group containing an oxygen atom as an ether bond, a carbonyl bond or an ester bond, an alkylcarbonyl group or an alkoxycarbonyl group; n denotes an integer from 1 to 4; and M represents a divalent metallic atom, a trivalent monosubstituted metallic atom, a tetravalent disubstituted metallic atom or an oxymetal.

A tenth embodiment of the invention is a dye-containing curable composition of the ninth embodiment, wherein $R^1$ and $R^2$ each independently represent an unsubstituted alkyl group having 1 to 8 carbon atoms, a substituted alkyl group having 1 to 12 carbon atoms and substituted with a group containing 1 to 4 oxygen atoms as ether bonds, carbonyl bonds or ester bonds, or an alkylcarbonyl group having 2 to 12 carbon atoms.

An eleventh embodiment of the invention is a dye-containing curable composition of the ninth or tenth embodiment, wherein n denotes an integer from 3 or 4.

A twelfth embodiment of the invention is a dye-containing curable composition of one of the ninth to eleventh embodiments, wherein M represents Cu, Co, Pd, VO, AlCl or AlOH.

A thirteenth embodiment of the invention is a dye-containing curable composition of one of ninth to twelfth embodiments, wherein the photosensitive compound is a naphthoquinonediazide compound.

A fourteenth embodiment of the invention is a dye-containing curable composition of the thirteenth embodiment, further containing a crosslinking agent.

A fifteenth embodiment of the invention is a dye-containing curable composition of one of the ninth to twelfth embodiments, wherein the photosensitive compound is a photopolymerization initiator, and the dye-containing curable composition further contains a crosslinking agent.

A sixteenth embodiment of the invention is a color filter containing at least an alkali soluble resin and a dye, the dye being a phthalocyanine compound represented by the following general formula (IV):

General Formula (IV)

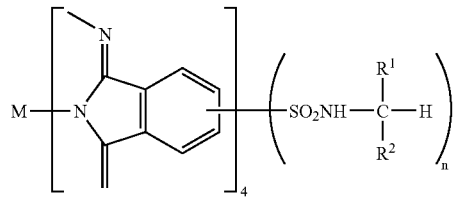

wherein $R^1$ and $R^2$ each independently represent an unsubstituted alkyl group, a substituted alkyl group substituted with a group containing an oxygen atom as an ether bond, a carbonyl bond or an ester bond, an alkylcarbonyl group or an alkoxycarbonyl group, provided that at least one of $R^1$ and $R^2$ represents a substituted alkyl group substituted with a group containing an oxygen atom as an ether bond, a carbonyl bond or an ester bond, an alkylcarbonyl group or an alkoxycarbonyl group; n denotes an integer from 1 to 4; and M represents a divalent metallic atom, a trivalent monosubstituted metallic atom, a tetravalent disubstituted metallic atom or an oxymetal.

The color filter according to the sixteenth embodiment can be constituted, for example, with a dye-containing curable composition of one of the ninth to fifteenth embodiments.

A seventeenth embodiment of the invention is a process for producing a color filter containing steps of coating a dye-containing curable composition of one of the ninth to fifteenth embodiments on a support; exposing the coated composition through a mask; and developing the exposed composition to form a pattern.

EXAMPLES

The present invention will be described in more detail with reference to examples, but the invention is not construed as being limited to the examples unless the spirit and scope of the invention is overrode. All the "parts" are by mass unless otherwise indicated.

Example 1

(1) Preparation of Resist Solution

| | |
|---|---|
| Propylene glycol monomethyl ether acetate (PGMEA) | 5.20 parts |
| Ethyl lactate (EL) | 50.6 parts |
| Alkali soluble resin (41% EL solution of benzyl methacrylate/methacrylic acid/2-hydroxyethyl methacrylate copolymer, copolymerization ratio: 60/20/20 by mole) | 30.5 parts |
| Dipentaerythritol hexaacrylate | 12.2 parts |
| Polymerization inhibitor (p-methoxyphenol) | 0.006 part |
| Fluorine surfactant | 0.80 part |
| Photopolymerization initiator (TAZ-107, produced by Midori Kagaku Co., Ltd.) | 0.68 part |

The foregoing components were mixed and dissolved to prepare a resist solution.

(2) Production of Glass Substrate Having Undercoating Layer

A glass substrate (Corning 1737) was washed with a 1% NaOH aqueous solution under ultrasonic wave, and then subjected to washing with water and dehydration baking (at 200° C. for 30 minutes). The resist solution obtained in the item (1) was coated on the glass substrate after washing to a thickness of 2 μm with a spin coater and dried by heating to 220° C. for 1 hour to form a cured film (undercoating layer).

(3) Preparation of Dye Resist Solution (Negative Type)

9.4 g of the resist solution obtained in the item (1) and 0.65 g of α-tetra-(2,2,3,3,4,4,5,5-octafluoropentyloxy)-cobaltphthalocyanine (compound represented by the general formula (I)) as the dye according to the invention were mixed and dissolved to obtain a dye resist solution (a negative solution of the dye-containing curable composition of the invention).

(4) Exposure and Development of Dye-containing Curable Composition (Image Forming Step)

The dye resist solution obtained in the item (3) was coated on the undercoating layer of the glass substrate having the undercoating layer obtained in the item (2) to a thickness of 1.0 μm with a spin coater and pre-baked at 110° C. for 60 seconds.

The coated layer of the dye-containing curable composition was irradiated with light having a wavelength of 365 nm through a 20-μm mask to an exposure amount of 500 mJ/cm$^2$. After irradiation, the exposed coated layer was developed by using a developer, CD-2000 (produced by Fujifilm Arch Co., Ltd.), at 25° C. for 40 seconds. Thereafter, the developed coated layer was rinsed with flowing water for 30 seconds and spray-dried to obtain a pattern image of cyan color. The formation of the image was confirmed by the ordinary method with a light microscope and SEM photography. The pattern image thus formed exhibited a rectangular profile.

(5) Evaluation

<Storage Stability>

The dye resist solution thus prepared was stored for 1 month at room temperature, and an extent of deposition of foreign matter was visually evaluated according to the following criteria.

[Criteria]

AA: Completely no deposition of foreign matter was observed.

A: Substantially no deposition of foreign matter was observed.

B: Slight deposition of foreign matter was observed.

C: Significant deposition of foreign matter was observed.

<Heat Resistance>

A glass substrate that was coated with the dye resist solution was placed on a hot plate so that the substrate surface was in contact with the hot plate, and heated at 200° C. for 1 hour. The change in chromaticity ΔEab before and after heating was measured by using a color meter, MCPD-1000, produced by Otsuka Electronics Co., Ltd. The resulting ΔEab value was used as an index indicating the extent of heat resistance and evaluated according to the following criteria. A smaller ΔEab value indicates a superior heat resistance.

[Criteria]

A: The ΔEab value was 5 or less.

B: The ΔEab value was from 5 to 10.

C: The ΔEab value was 10 or more.

<Light Resistance>

A glass substrate that was coated with the dye resist solution was irradiated by using a xenon lamp at 100,000 lux for 20 hours (corresponding to 2,000,000 lux-hr), and the change in chromaticity ΔEab before and after irradiation was measured. The resulting ΔEab value was used as an index indicating the extent of heat resistance and evaluated according to the following criteria. A smaller ΔEab value indicates a superior light resistance.

[Criteria]

A: The ΔEab value was 3 or less.

B: The ΔEab value was from 3 to 10.

C: The ΔEab value was 10 or more.

Examples 2 to 14

A pattern image was formed and evaluated in the same manner as in Example 1 except that the dye used upon preparation of the dye resist solution (3) in Example 1 was changed to the dyes shown in Table 1 below. The evaluation results are shown in Table 1.

Comparative Examples 1 to 6

A pattern image was formed and evaluated in the same manner as in Example 1 except that the dye used upon preparation of the dye resist solution (3) in Example 1 was changed to the dyes shown in Table 1 below. The evaluation results are shown in Table 1.

TABLE 1

| | Dye | Storage stability | Heat resistance | Light resistance |
|---|---|---|---|---|
| Example 1 | α-tetra(2,2,3,3,4,4,5,5-octafluoropentyloxy)-cobaltphthalocyanine | AA | A | A |
| Example 2 | α-tetra(2,2,3,3,4,4,5,5-octafluoropentyloxy)-vanadylphthalocyanine | A | A | A |
| Example 3 | α-tetra(2,2,3,3,4,4,5,5-octafluoropentyloxy)-copperphthalocyanine | A | A | A |
| Example 4 | α-tetra(2,2,3,3,4,4,5,5-octafluoropentyloxy)-zincphthalocyanine | A | A | A |
| Example 5 | α-tetra(2,2,3,3,4,4,5,5-octafluoropentyloxy)-palladiumphthalocyanine | A | A | A |
| Example 6 | α-tetra(2,2,3,3-tetrafluoropropoxy)-cobaltphthalocyanine | AA | A | A |
| Example 7 | α-tetra(2,2,3,3-tetrafluoropropoxy)-vanadylphthalocyanine | A | B | A |
| Example 8 | α-tetra(2,2,3,3-tetrafluoropropoxy)-copperphthalocyanine | B | A | A |
| Example 9 | α-tetra(2,2,3,3-tetrafluoropropoxy)-zincphthalocyanine | A | A | B |
| Example 10 | α-tetra(2,2,2-trifluoroethoxy)-cobaltphthalocyanine | A | A | A |
| Example 11 | α-tetra(2,2,2-trifluoroethoxy)-vanadylphthalocyanine | B | A | A |
| Example 12 | β-tetra(2,2,3,3,4,4,5,5-octafluoropentyloxy)-cobaltphthalocyanine | B | A | B |
| Example 13 | β-tetra(2,2,3,3-tetrafluoropropoxy)-cobaltphthalocyanine | B | B | A |
| Example 14 | β-tetra(2,2,2-trifluoroethoxy)-cobaltphthalocyanine | B | A | B |
| Comparative Example 1 | α-tetra-pentyloxy-copperphthalocyanine | B | C | B |
| Comparative Example 2 | α-tetra-pentyloxy-cobaltphthalocyanine | C | B | C |
| Comparative Example 3 | α-tetra-propoxy-copperphthalocyanine | B | C | B |
| Comparative Example 4 | tetra-propoxy-cobaltphthalocyanine | C | B | C |
| Comparative Example 5 | α-tetra-propoxy-vanadylphthalocyanine | C | C | B |
| Comparative Example 6 | β-tetra-propoxy-vanadylphthalocyanine | C | B | C |

As shown in Table 1, the dye-containing curable compositions according to the invention containing the phthalocyanine compound represented by the general formula (I) as a dye was good in storage stability, formed pattern images exhibiting a rectangular profile, and was excellent in heat resistance and light resistance. Examples 1 to 11 where the substitution positions of fluorine-substituted alkoxy groups on the phthalocyanine skeleton of the dye were the α-positions were better in all storage stability, heat resistance and light resistance than Examples 12 to 14 where the substitution positions were the β-positions.

On the other hand, even in the case where the α-positions of the phthalocyanine skeleton of the dye were substituted, all the storage stability, heat resistance and light resistance could not be satisfied when the substituents were alkoxy groups as in Comparative Examples 1 to 6.

Example 15

(1) Preparation of Dye Resist Solution (Positive Dye-containing Curable Composition)

| | |
|---|---|
| Ethyl lactate (EL) | 30 parts |
| Resin P-1 shown below | 3.5 parts |
| Naphthoquinonediazide compound N-1 shown below | 2 parts |
| Hexamethoxymethylol melamine (crosslinking agent) | 0.5 part |
| TAZ-107 (photosensitive acid generating agent, produced by Midori Kagaku Co., Ltd.) | 1 part |
| Fluorine surfactant (F-475, Dainippon Ink And Chemicals, Inc.) | 0.4 part |
| α-Tetra(2,2,3,3,4,4,5,5-octafluoropentyloxy)-cobaltphthalocyanine (compound represented by the general formula (I)) | 2 parts |

The foregoing components were mixed and dissolved to prepare a positive dye-containing curable composition in the form of a liquid.

<Synthesis of Resin P-1>

123.35 g of benzyl methacrylate, 17.21 g of methacrylic acid, 13.01 g of 2-hydroxyethyl methacrylate and 600 g of 2-methoxypropanol were charged in a three-neck flask, and after attaching a stirrer, a reflux condenser and a thermometer thereto, a catalytic amount of a polymerization initiator, V-65, produced by Wako Pure Chemical Industries, Ltd., was added thereto, followed by stirring at 70° C. under a nitrogen stream for 8 hours. The resulting resin solution added dropwise to 20 L of ion exchanged water under vigorous stirring to obtain white powder. The resulting white powder was dried under vacuum at 40° C. for 24 hours to obtain 145 g of the resin P-1. Measurement of the compositional ratio of the resin P-1 with $^{13}$C-NMR revealed that the ratio of benzyl methacrylate/methacrylic acid/2-hydroxyethyl methacrylate was 7/2/1 by mole. Measurement of the molecular weight of the resin P-1 with GPC revealed that the weight average molecular weight Mw was 25,000, the number average molecular weight Mn was 10,000, and the molecular weight distribution Mw/Mn was 2.5.

<Synthesis of Naphthoquinonediazide Compound N-1>

42.45 g of TrisP-PA (produced by Honshu Chemical Industry Co., Ltd.), 61.80 g of o-naphthoquinonediazide-5-sulfonyl chloride and 300 mL of acetone were charged in a three-neck flask, and 24.44 g of triethylamine was added dropwise thereto at room temperature over 1 hour. The mixture was further stirred for 2 hours after completing the dropwise addition, and then the resulting reaction mixture was poured to a large amount of water under stirring. Naphthoquinonediazide sulfonate thus precipitated was collected by suction filtration and dried at 40° C. for 24 hours to obtain the naphthoquinonediazide compound N-1.

(2) Exposure, Development and Evaluation of Dye-containing Curable Composition

Coating, pre-baking, irradiation, development, rinsing and drying were carried out in the same manner as in Example 1 to obtain a pattern image of cyan color, and the pattern image was then heated at 180° C. for 5 minutes. The pattern image thus formed exhibited a rectangular profile. The evaluations for storage stability of the dye-containing curable composition, and heat resistance and light resistance of the pattern image were carried out in the same manner as in Example 1, and thus it was found that all the evaluations revealed good results as shown in Table 2 below.

TABLE 2

| | Dye | Storage stability | Heat resistance | Light resistance |
|---|---|---|---|---|
| Example 15 | α-tetra-(2,2,3,3,4,4,5,5-octafluoropentyloxy)-cobaltphthalocyanine | AA | A | A |

Examples 16 to 29

The same procedures as in Examples 1 to 14 were repeated except that the glass substrate as in Examples 1 to 14 was changed to a silicon wafer substrate, so as to obtain silicon substrates having the dye resist solution coated thereon. Irradiation was made by using an i-line reduced projection exposure apparatus to a square pattern of 2 μm to an exposure amount of 500 mJ/cm$^2$. After the irradiation, development was carried out by using a 60% solution of CD-2000 (produced by Fujifilm Arch Co., Ltd.), at 26° C. for 60 seconds. Thereafter, it was rinsed with flowing water for 20 seconds and spray-dried. According to the procedures, a pattern having a rectangular cross section of cubic shapes suitable for a color filter for CCD was obtained.

Example 30

Preparation of Resist Solution

| | |
|---|---|
| Propylene glycol monomethyl ether acetate (PGMEA) | 5.20 parts |
| Ethyl lactate (EL) | 52.6 parts |
| Alkali soluble resin (41% EL solution of benzyl methacrylate/methacrylic acid/2-hydroxyethyl methacrylate copolymer, copolymerization ratio: 60/20/20 by mole) | 30.5 parts |
| Dipentaerythritol hexaacrylate | 10.2 parts |
| Polymerization inhibitor (p-methoxyphenol) | 0.006 part |
| Fluorine surfactant | 0.80 part |
| Photopolymerization initiator (TAZ-107, produced by Midori Kagaku Co., Ltd.) | 0.58 part |

The foregoing components were mixed and dissolved to prepare a resist solution.

(2) Production of Glass Substrate Having Undercoating Layer

A glass substrate (Corning 1737) was washed with a 0.5% NaOH aqueous solution under ultrasonic wave, and then subjected to washing with water and dehydration baking (at 200° C. for 20 minutes). The resist solution obtained in the item (1) was coated on the glass substrate after washing to a thickness of 2 μm with a spin coater and dried by heating to 220° C. for 1 hour to form a cured film (undercoating layer).

(3) Preparation of Dye Resist Solution (Negative Dye-containing Curable Composition)

9.4 g of the resist solution obtained in the item (1) and 0.60 g of Example Compound 21 (compound represented by the general formula (IV)) as a dye were mixed and dissolved to obtain a dye resist solution (a negative solution of the dye-containing curable composition of the invention).

(4) Exposure and Development of Dye-containing Curable Composition (Image Forming Step)

The dye resist solution obtained in the item (3) was coated on the undercoating layer of the glass substrate having the undercoating layer obtained in the item (2) to a thickness of 1.0 μm with a spin coater and pre-baked at 110° C. for 120 seconds.

The coated layer of the dye-containing curable composition was irradiated with light having a wavelength of 365 nm through a 20-μm mask to an exposure amount of 500 mJ/cm$^2$. After irradiation, the exposed coated layer was developed by using a developer, CD-2000 (produced by Fujifilm Arch Co., Ltd.), at 25° C. for 40 seconds. Thereafter, the developed coated layer was rinsed with flowing water for 30 seconds and spray-dried to obtain a pattern image of cyan color. The formation of the image was confirmed by the ordinary method with a light microscope and SEM photography. The pattern image thus formed exhibited a rectangular profile.

(5) Evaluation

<Storage Stability>

The dye resist solution thus prepared was stored for 1 month at room temperature, and an extent of deposition of foreign matter was visually evaluated according to the following criteria.

[Criteria]

AA: Completely no deposition of foreign matter was observed.

B: Slight deposition of foreign matter was observed.

C: Significant deposition of foreign matter was observed.

<Heat Resistance>

A glass substrate that was coated with the dye resist solution was placed on a hot plate so that the substrate surface was in contact with the hot plate, and heated at 200° C. for 1 hour. The change in chromaticity ΔEab before and after heating was measured by using a color meter, MCPD-1000, produced by Otsuka Electronics Co., Ltd. The resulting ΔEab value was used as an index indicating the extent of heat resistance and evaluated according to the following criteria. A smaller ΔEab value indicates a superior heat resistance.

[Criteria]

A: The ΔEab value was 5 or less.

B: The ΔEab value was from 5 to 10.

C: The ΔEab value was 10 or more.

<Light Resistance>

A glass substrate that was coated with the dye resist solution was irradiated by using a xenon lamp at 50,000 lux for 20 hours (corresponding to 1,000,000 lux·hr), and the change in chromaticity ΔEab before and after irradiation was measured. The resulting ΔEab value was used as an index indicating the extent of heat resistance and evaluated according to the following criteria. A smaller ΔEab value indicates a superior light resistance.

[Criteria]
A: The ΔEab value was 3 or less.
B: The ΔEab value was from 3 to 10.
C: The ΔEab value was 10 or more.

<Evaluation of Solubility>

The solubility of the dye (Example Compound 21, a phthalocyanine compound represented by the general formula (IV)) used in the aforementioned item (3) (preparation of a dye resist solution) was evaluated based on an amount thereof that was dissolved in 100 g of ethyl lactate (EL) separately provided at 25° C. according to the following criteria.

[Criteria]
A: The amount dissolved in 100 g of ethyl lactate at 25° C. was 3 g or more.
C: The amount dissolved in 100 g of ethyl lactate at 25° C. was less than 3 g.

Examples 31 to 39

A pattern image was formed and evaluated in the same manner as in Example 30 except that the dye used upon preparation of the dye resist solution (3) in Example 30 was changed to the dyes shown in Table 3 below. The evaluation results are shown in Table 3.

Comparative Examples 7 to 10

A pattern image was formed and evaluated in the same manner as in Example 30 except that the dye used upon preparation of the dye resist solution (3) in Example 30 was changed to the following dyes (Comparative Dyes 1 to 4). The evaluation results are shown in Table 3.

| | Structural formula |
|---|---|
| Comparative Dye 1 | 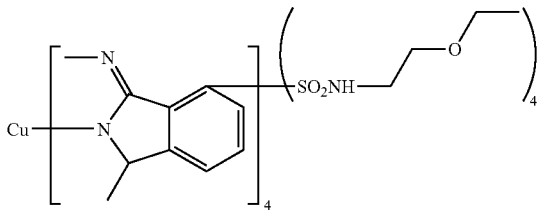 |
| Comparative Dye 2 | 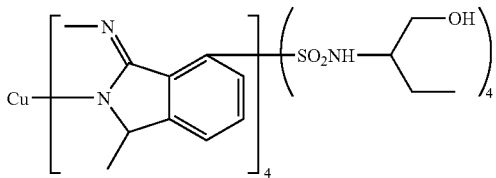 |
| Comparative Dye 3 | 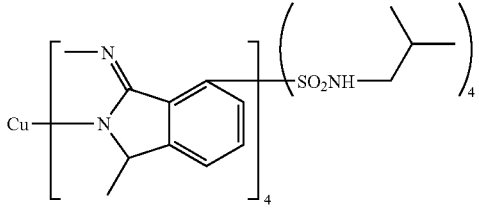 |
| Comparative Dye 4 | 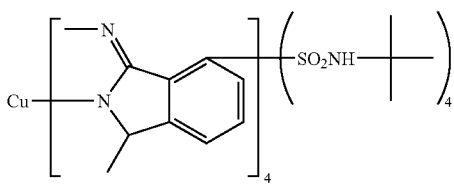 |

TABLE 3

| | Dye (*1) | Storage stability | Heat resistance | Light resistance | Solvent solubility of dye |
|---|---|---|---|---|---|
| Example 30 | Example Compound 21 | A | A | A | A |
| Example 31 | Example Compound 23 | A | A | A | A |
| Example 32 | Example Compound 25 | A | B | A | A |
| Example 33 | Example Compound 28 | A | A | A | A |
| Example 34 | Example Compound 32 | A | B | B | A |
| Example 35 | Example Compound 34 | A | A | A | A |
| Example 36 | Example Compound 37 | A | A | A | A |
| Example 37 | Example Compound 38 | B | A | A | A |
| Example 38 | Example Compound 46 | A | A | B | A |
| Example 39 | Example Compound 50 | A | A | A | A |
| Comparative Example 7 | Comparative Dye 1 | C | A | B | C |
| Comparative Example 8 | Comparative Dye 2 | C | A | B | C |
| Comparative Example 9 | Comparative Dye 3 | C | A | B | C |
| Comparative Example 10 | Comparative Dye 4 | C | A | A | C |

Note:
(*1) Example Compounds shown as dyes are the example compounds represented by the general formula (IV).

As shown in Table 3, the phthalocyanine compound represented by the general formula (IV) was excellent in solvent solubility, and the dye-containing curable compositions according to the invention containing the compound as a dye was good in storage stability and was excellent in heat resistance and light resistance. Furthermore, it formed pattern images exhibiting a rectangular profile.

On the other hand, the dyes containing no sulfonamide group, where a secondary alkyl group having an oxygen atom in the form of an ether bond, a carbonyl bond or an ester bond was bonded to the N (nitrogen) atom, as in Comparative Examples 7 to 10 were inferior in solubility, and the composition of the comparative examples were particularly inferior in storage stability while they were good in heat resistance and light resistance in some extent.

Example 40

(1) Preparation of Dye Resist Solution (Positive Dye-containing Curable Composition)

| | |
|---|---|
| Ethyl lactate (EL) | 30 parts |
| Resin P-2 shown below | 3.0 parts |
| Naphthoquinonediazide compound N-1 shown below | 1.8 parts |
| Hexamethoxymethylol melamine (crosslinking agent) | 0.6 part |
| TAZ-107 (photosensitive acid generating agent, produced by Midori Kagaku Co., Ltd.) | 1.2 part |
| Fluorine surfactant (F-475, Dainippon Ink And Chemicals, Inc.) | 0.0005 part |
| Dye (Example Compound 21, compound represented by the general formula (IV)) | 1.5 parts |

The foregoing components were mixed and dissolved to prepare a resist solution (the dye-containing curable composition (positive-type) of the invention). <Synthesis of Resin P-2>

70.0 g of benzyl methacrylate, 13.0 g of methacrylic acid, 17.0 g of 2-hydroxyethyl methacrylate and 600 g of 2-methoxypropanol were charged in a three-neck flask, and after attaching a stirrer, a reflux condenser and a thermometer thereto, a catalytic amount of a polymerization initiator, V-65, produced by Wako Pure Chemical Industries, Ltd., was added thereto, followed by stirring at 65° C. under a nitrogen stream for 10 hours. The resulting resin solution added dropwise to 20 L of ion exchanged water under vigorous stirring to obtain white powder. The resulting white powder was dried under vacuum at 40° C. for 24 hours to obtain 145 g of the resin P-2. Measurement of the molecular weight of the resin P-2 with GPC revealed that the weight average molecular weight Mw was 28,000, and the number average molecular weight was Mn 11,000.

<Synthesis of Naphthoquinonediazide Compound N-1>

Naphthoquinonediazide compound N-1 was obtained in the same manner as in Example 15.

(2) Exposure, Development and Evaluation of Dye-containing Curable Composition

Coating, pre-baking, irradiation, development, rinsing and drying were carried out in the same manner as in Example 30 to obtain a pattern image of cyan color, and the pattern image was then heated at 180° C. for 5 minutes. The pattern image thus formed exhibited a rectangular profile. The evaluations for storage stability of the dye-containing curable composition, and heat resistance and light resistance of the pattern image were carried out in the same manner as in Example 30, and thus it was found that all the evaluations revealed good results as shown in Table 4 below.

TABLE 4

| | Dye (*2) | Storage stability | Heat resistance | Light resistance |
|---|---|---|---|---|
| Example 40 | Example Compound 21 | A | B | A |

Note:
(*2) Example Compound shown as a dye is the example compound represented by the general formula (IV).

Examples 41 to 50

The same procedures as in Examples 30 to 39 were repeated except that the glass substrate as in Examples 30 to 39 was changed to a silicon wafer substrate, so as to obtain silicon substrates having the dye resist solution coated thereon. Irradiation was made by using an i-line reduced projection exposure apparatus to a square pattern of 2 μm to an exposure amount of 500 mJ/cm$^2$. After the irradiation, development was carried out by using a 60% solution of CD-2000 (produced by Fujifilm Arch Co., Ltd.), at 23° C. for 60 seconds. Thereafter, it was rinsed with flowing water for 30 seconds and spray-dried. According to the procedures, a pattern having a rectangular cross section of cubic shapes suitable for a color filter for CCD was obtained.

According to the invention, there is provided such a stable dye-containing curable composition that contains a phthalocyanine compound excellent in solvent solubility and is good in heat resistance and light resistance, and that is particularly suitable for cyan color.

According to the invention, there are provided such a color filter that is good in sharpness and hue and is particularly excellent in heat resistance and light resistance, and a process for producing a color filter capable of producing such a color filter that is constituted to have a high resolution with a good rectangular pattern and has heat resistance and light resistance.

What is claimed is:

1. A dye-containing curable composition comprising: an alkali soluble resin, a dye, and a photosensitive compound, the dye being a phthalocyanine compound represented by the following formula (III):

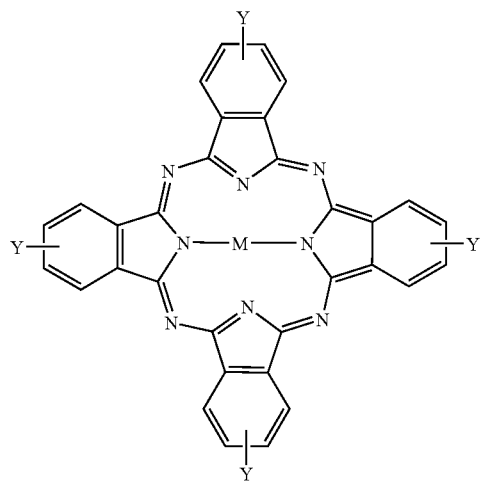

Formula (III)

wherein M represents a cobalt atom and Y represents the following formula (II)

—O—$(CH_2)_m(CF_2)_n$X    Formula (II)

wherein X represents a hydrogen atom or a fluorine atom; m denotes an integer from 1 to 6; and n denotes an integer from 1 to 8.

2. The dye-containing curable composition of claim 1, wherein the phthalocyanine compound is an α-tetra(fluoroalkoxy)-substituted phthalocyanine compound, in which a substitution position of Y is an α-position of the phthalocyanine skeleton; m denotes 1 or 2; and n denotes an integer from 3 to 5.

3. The dye-containing curable composition of claim 1, containing the dye represented by the formula (III) in an amount of 1 to 80% by mass based on a total solid content (by mass) of the dye-containing curable composition.

4. The dye-containing curable composition of claim 1, wherein the photosensitive compound is a naphthoquinonediazide compound.

5. The dye-containing curable composition of claim 4, further comprising a crosslinking agent.

6. The dye-containing curable composition of claim 1, wherein the photosensitive compound is a photopolymerization initiator, and the dye-containing curable composition further comprises a crosslinking agent.

7. A dye-containing curable composition comprising: an alkali soluble resin, a dye, and a photosensitive compound, the dye being a phthalocyanine compound represented by the following formula:

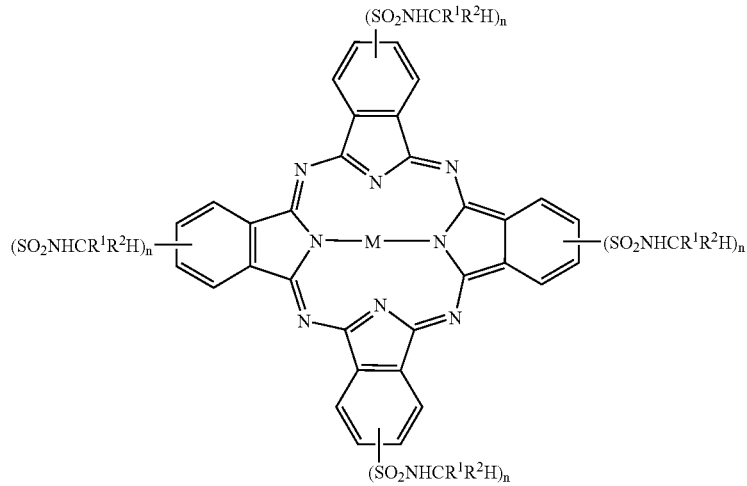

wherein $R^1$ and $R^2$ each independently represent an unsubstituted alkyl group, a substituted alkyl group substituted with a group containing an oxygen atom as an ether bond, a carbonyl bond or an ester bond, an alkylcarbonyl group or an alkoxycarbonyl group, provided that at least one of $R^1$ and $R^2$ represents a substituted alkyl group substituted with a group containing an oxygen atom as an ether bond, a carbonyl bond or an ester bond, an alkylcarbonyl group or an alkoxycarbonyl group; n denotes an integer from 0 to 1; and M represents a divalent metallic atom, a trivalent monosubstituted metallic atom, a tetravalent disubstituted metallic atom or an oxymetal.

8. The dye-containing curable composition of claim 7, wherein $R^1$ and $R^2$ each independently represent an unsubstituted alkyl group having 1 to 8 carbon atoms, a substituted alkyl group having 1 to 12 carbon atoms and substituted with a group containing 1 to 4 oxygen atoms as ether bonds, carbonyl bonds or ester bonds, or an alkylcarbonyl group having 2 to 12 carbon atoms.

9. The dye-containing curable composition of claim 7, wherein M represents one selected from the group consisting of Cu, Co, Pd, VO, AlCl and AlOH.

10. The dye-containing curable composition of claim 7, wherein the photosensitive compound is a naphthoquinonediazide compound.

11. The dye-containing curable composition of claim 10, further comprising a crosslinking agent.

12. The dye-containing curable composition of claim 7, wherein the photosensitive compound is a photopolymerization initiator, and the dye-containing curable composition further comprises a crosslinking agent.

* * * * *